United States Patent
Chery et al.

(10) Patent No.: US 9,252,386 B2
(45) Date of Patent: Feb. 2, 2016

(54) BACK-EMITTING OLED DEVICE AND METHOD FOR HOMOGENIZING THE LUMINANCE OF A BACK-EMITTING OLED DEVICE

(71) Applicant: SAINT-GOBAIN GLASS FRANCE, Courbevoie (FR)

(72) Inventors: Vincent Chery, Paris (FR); Fabien Lienhart, San Diego, CA (US); Vincent Sauvinet, Grenoble (FR)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/369,266

(22) PCT Filed: Dec. 28, 2012

(86) PCT No.: PCT/FR2012/053098
§ 371 (c)(1),
(2) Date: Jun. 27, 2014

(87) PCT Pub. No.: WO2013/098534
PCT Pub. Date: Jul. 4, 2013

(65) Prior Publication Data
US 2015/0008412 A1 Jan. 8, 2015

(30) Foreign Application Priority Data
Dec. 30, 2011 (FR) ...................... 11 62578

(51) Int. Cl.
*H01L 29/08* (2006.01)
*H01L 35/24* (2006.01)
(Continued)

(52) U.S. Cl.
CPC ........ *H01L 51/5225* (2013.01); *H01L 51/5203* (2013.01); *H01L 51/5206* (2013.01);
(Continued)

(58) Field of Classification Search
USPC .............................................. 257/40; 438/29
See application file for complete search history.

(56) References Cited

U.S. PATENT DOCUMENTS

| 2008/0197371 A1 | 8/2008 | Ottermann |
| 2015/0008413 A1* | 1/2015 | Chery et al. .................... 257/40 |

FOREIGN PATENT DOCUMENTS

| EP | 1 536 492 | 6/2005 |
| WO | WO 99/02017 | 1/1999 |

(Continued)

OTHER PUBLICATIONS

Jordan, R. H., et al., "Efficiency enhancement of microcavity organic light emitting diodes," Appl. Phys. Lett., vol. 69, No. 14, Sep. 30, 1996, pp. 1997-1999.

(Continued)

*Primary Examiner* — Telly Green
(74) *Attorney, Agent, or Firm* — Pillsbury Winthrop Shaw Pittman LLP

(57) ABSTRACT

An OLED device includes a transparent anode, of sheet resistance R1, and a cathode, of sheet resistance R2, the ratio r=R2/R1 ranging from 0.01 to 2.5, a first anode electrical contact, a first cathode electrical contact, arranged above the active zone, and a reflector covering the active zone above an OLED system, and for each point B of the anode contact, the point B being in an edge of the first anodic region, on defining a distance D between B and the point C closest to the point B, and on defining a distance L between the point B and a point X of an opposite edge of the first anodic region from the first edge, and passing through Ci the following criteria are defined:
if $0.01 \leq r < 0.1$, then $30\% < D/L < 48\%$, if $0.1 \leq r < 0.5$, then $10\% < D/L < 45\%$,
if $0.5 \leq r < 1$, then $10\% < D/L < 45\%$, if $1 \leq r < 1.5$, then $5\% < D/L < 35\%$,
if $1.5 \leq r \leq 2.5$, then $5\% < D/L < 30\%$.

17 Claims, 15 Drawing Sheets

(51) Int. Cl.
*H01L 51/00* (2006.01)
*H01L 51/52* (2006.01)
*H01L 51/56* (2006.01)

(52) U.S. Cl.
CPC ........ *H01L51/5209* (2013.01); *H01L 51/5212* (2013.01); *H01L 51/5228* (2013.01); *H01L 51/5271* (2013.01); *H01L 51/56* (2013.01); *H01L 2251/5361* (2013.01)

(56) References Cited

FOREIGN PATENT DOCUMENTS

| WO | WO 2007/102103 | 9/2007 |
| WO | WO 2008/029060 | 3/2008 |
| WO | WO 2009/007899 | 1/2009 |
| WO | WO 2009/083693 | 7/2009 |

OTHER PUBLICATIONS

Neyts, K., et al., "Semitransparent metal or distributed Bragg reflector for wide-viewing-angle organic light-emitting-diode microcavities," J. Opt. Soc. Am. B, vol. 17, No. 1, Jan. 2000, pp. 114-119.

International Preliminary Report on Patentability, issued in International Application No. PCT/FR2012/053098, dated Jul. 1, 2014.

International Search Report issued for International Application No. PCT/FR2012/053098, dated Apr. 12, 2013.

\* cited by examiner

BACK-EMITTING OLED DEVICE AND METHOD FOR HOMOGENIZING THE LUMINANCE OF A BACK-EMITTING OLED DEVICE

CROSS-REFERENCE TO RELATED APPLICATIONS

This application is the U.S. National Stage of PCT/FR2012/053098, filed Dec. 28, 2012 which in turn claims priority to French Application No. 1162578, filed Dec. 30, 2011. The content of both applications are incorporated herein by reference in their entirety.

The subject of the present invention is an organic light-emitting diode device and a method for homogenizing the luminance of a back-emitting OLED device.

Known organic light-emitting systems or OLEDs (for "Organic Light Emitting Diodes") comprise a stack of organic light-emitting layers supplied with electricity by electrodes bracketing it in the form of electroconducting thin layers. When a voltage is applied between the two electrodes, the electric current passes through the organic layer, thus generating light by electroluminescence.

In a back-emitting OLED device (or "bottom" OLED), the upper electrode, or cathode, is a reflecting metallic layer typically with sheet resistance of less than or equal to 0.1 $\Omega$/square and the lower electrode or anode is a transparent layer, deposited on a glass or plastic substrate allowing the emitted light to pass through, of sheet resistance of several orders of magnitude higher.

Document WO99/02017 notes that a very large difference in sheet resistance between the anode and the cathode leads at one and the same time to an inhomogeneity in the luminance, a decrease in duration and in reliability, most particularly for large-size devices. Hence, it proposes an organic light-emitting diode device with a transparent anode of given sheet resistance R1 and a cathode with a similar given sheet resistance R2, the ratio $r=R2/R1$ lying between 0.3 and 3.

By way of example, the anode is a layer of ITO of sheet resistance 10 ohms and the cathode is a thin layer of ytterbium of sheet resistance 9.9 ohms i.e. r of around 1.

The gain in homogeneity is, however, not yet optimal and is not even certain for all OLED configurations.

Hence, the subject of the present invention is an organic light-emitting diode device, so-called OLED, comprising a transparent substrate with a first main face comprising a stack comprising in this order, starting from said first face:
  (directly on the first face or on a sub-layer for example) a lower electrode forming an anode, which is transparent, preferably comprising at least one electroconducting layer, anode of given sheet resistance R1, in particular R1 being less than 30 Ohm/square or indeed less than or equal to 15 Ohm/square or even 10 Ohm/square, the anode having a given anodic surface, the characteristic dimension of the anodic surface preferably being at least 2 cm, or indeed 5 cm,
  an organic light-emitting system above the anode,
  an upper electrode forming a cathode, above the organic light-emitting system (or indeed directly on the system), preferably comprising an electroconducting layer, cathode of given sheet resistance R2, cathode preferably of constant given thickness, with a ratio $r=R2/R1$ ranging from 0.01 to 2.5,
  the anode, the organic light-emitting system and the cathode thus defining a, so-called active, common zone (corresponding to the illuminating surface minus any optional inner anode contacts, if too opaque).

The OLED device furthermore comprises:
  at least one anode electrical contact, in particular layer-like, termed the first tailored anode contact, the first tailored contact delimiting alone or with one or more second so-called tailored anode contacts, in particular point-like, the (external) contour of a first region of the anode surface termed the first anodic region, (a potential V being applied at the boundary of the anode),
  a first cathode electrical contact, in particular layer-like, which is:
    arranged above the active zone, partially covering the region of the cathode above the first anodic region,
    of given surface, termed the contact surface, smaller than the surface area of the active zone and than the surface area of the first anodic region,
    offset from the first tailored anode contact and from optional second tailored anode contact(s), at every point of the contact surface.
  And for (at least a majority, or indeed 80% and preferably) each point B of the first tailored anode contact and of each optional second tailored anode contact, the point B being in a (first) given edge of the first anodic region, on defining a distance D between said point B and that point C of the contact surface which is closest to said point B, and on defining a distance L between said point B and a point X of an opposite edge of the first anodic region from the first edge, and passing through C, the following criteria are defined:
    if $0.01 \leq r < 0.1$, then $30\% < D/L < 48\%$,
    if $0.1 \leq r < 0.5$, then $10\% < D/L < 45\%$,
    if $0.5 \leq r < 1$, then $10\% < D/L < 45\%$,
    if $1 \leq r < 1.5$, then $5\% < D/L < 35\%$,
    if $1.5 \leq r < 2.5$, then $5\% < D/L < 30\%$.

More rigorously, D is the distance between B and the (orthogonal) projection of C onto the anode or better into the plane passing through B parallel to the anode, but having regard to the small height of the OLED, this does not change the criteria defined hereinabove.

And likewise more rigorously, L the distance between B and X on passing through the orthogonal projection of C in the plane passing through B parallel to the anode but having regard to the small height of the OLED, this does not change the criteria defined hereinabove.

It may therefore be preferred to define D and L in the plane passing through B parallel to the anode.

Finally, the OLED device comprises, above the organic light-emitting system, on moving away from the first face, a reflector covering the active zone.

According to the invention, "tailored anode contact" (that is to say the tailored first anode contact and also the tailored second anode contact(s)) is intended to mean an electrical contact having sufficient conduction such that, when the OLED is in operation, the voltage is the same at any point of the tailored contact. A result of this conduction property is that, between two points of the tailored contact, the variation in luminance in proximity to these two points is less than 5%. The role of the tailored anode contact is therefore to distribute one and the same electrical potential over the whole of its surface.

According to the invention, the first cathode electrical contact has sufficient conduction such that, when the OLED is in operation, the voltage is the same at any point of the first cathode contact. A result of this conduction property is that, between two points of this cathode contact, the variation in luminance in proximity to these two points is less than 5%. The role of this cathode contact is therefore to distribute one and the same electrical potential over the whole of its surface.

The aim of this invention is to fabricate the largest possible OLED satisfying a prerequisite criterion of homogeneity of luminance with an anode of given R1 and a given organic layer resistance rorg.

The Applicant has noted that the positions of the connection arrangements for the anode and cathode, in particular their positioning with respect to one another, as well as their shapes were critical. For a genuine gain in homogeneity, it is thus crucial:
- to choose the anode contact or contacts judiciously, in particular their position and their resistance (so that they are tailored),
- to place the first cathode contact correctly,
- and to distance the first cathode contact sufficiently from the tailored anode contact or contacts.

One thus obtains the most constant possible difference of potentials between the cathode and the anode over the whole of the illuminating surface.

The more that r (or r') is increased, the more necessary it is to increase the contact surface.

In particular for difficulties of fabrication, the ratio r is restricted to 2.5.

The expression "opposite edges" is taken in the wide sense and incorporates two opposite zones of a rounded anodic region (disk, ovoid contour, etc.).

D may be constant whatever the point B or vary while remaining with the ratio D/L according to the invention which depends drastically on the choice of the ratio r.

For better homogenization, the first cathode contact is present in the region or regions the furthest distant from the edges of the first anodic region (at the potential V).

It is indeed in these distant regions that the anode potential drops most drastically. According to the invention it is therefore necessary to compensate through a drop in potential in the cathode, this drop in potential being generated by the first cathode contact according to the invention.

For the commonplace anodic region shapes (polygons, round, etc.), this is naturally the central region—therefore the center and its surroundings—of the first anodic region.

Thus, the first cathode contact may advantageously extend from the central region (stated otherwise the center) of the first anodic region to the edges of the active zone at least in the direction of the tailored anode contact or contacts.

The upper limit of D/L recalls that the first cathode contact according to the invention deviates from a contact of point-like (or infinitely fine) type.

It is important that the first cathode contact therefore exhibits a sufficient contact surface.

For example, a cathode contact which then leaves some of the central zone inhomogeneous is not in accordance with the invention. It is possible to cite as counter-examples:
- a cathode contact in several pieces which are spaced too far apart in the central zone of the first anodic region,
- a hollow cathode contact forming too fine a frame or annulus.

Another counter-example of cathode contact (not in accordance with the invention) would be a cathode contact external to the active zone.

Another counter-example of cathode contact (not in accordance with the invention) would furthermore be a network of (resistive or even tailored) contacts, such as a grid or parallel bands, occupying just the inner periphery of the active zone (of width D) or the whole of the active zone.

The cathode contact according to the invention does not necessarily reproduce the symmetry of the active zone and/or of the first anodic region.

The cathode is preferably of constant given thickness in particular with a tolerance as a function of the fabrication method, for example ±10% for a thin layer type deposition.

The OLED according to the invention most particularly intended for lighting also the characteristic dimension, i.e. the largest dimension, such that the length or the diameter of the first anodic region can be at least 10 cm or indeed 15 cm.

The cathode being supplied electrically at a potential $V_c$, such that the difference of potential(s) between anode and cathode is suitable for lighting, in particular $V_c$, is grounded.

It is considered that a conventional thick cathode is ideal, that is to say it forms by itself a cathode contact (equipotential at every point of the cathode). The invention is distinguished from such a cathode through the increase in the sheet resistance of the cathode R2 and criteria on the contact surface.

The contact surface can be a solid surface, a grid-like surface (designed to maintain an equipotential), the surface optionally being star-like.

In fact, a contact surface, even solid, can be star-like, with thicker or thinner branches (in particular that may be regarded as lines). Preferably, the ends of the branches are spaced apart from a closest tailored anode contact point B1 by a distance D1 with D1/L1 obeying the same criteria on D/L.

The (substantially) solid contact surface (in particular a layer deposited on the anode) can exhibit surface discontinuities, but which are unable to disturb its function of equipotential in the region furthest distant from the tailored anode contact or contacts.

The solid surface may in particular be convex at least facing the tailored anode contact or contacts.

And, as already indicated, preferably the solid contact surface is not of hollow type.

It is furthermore preferred that the active zone be of solid type. In the case of an active zone with at least one (strong) constriction, it may be preferred not to have tailored anode contacts facing this constriction.

The cathode contact can be self-supported and overlaid onto the cathode for example a set of wires, sheet-like, etc.

Preferably the thickness of the first cathode contact is constant.

The first cathode contact can extend up to a zone or zones of edges of the active zone which do not comprise any tailored anode contact.

The first tailored contact for its part may be a solid layer or mesh type layer (tightened grid forming a band, etc.), or indeed a set of point-like anode contacts sufficiently close together to distribute the current, for example less than a few mm apart.

The first tailored contact, in particular substantially rectilinear, may be peripheral, peripheral taken in the wide sense therefore
- on an anode edge protruding from the edge of the light-emitting system (and the edge of the cathode above), therefore (at least in part) at the periphery external to the active zone, and in particular separated from the edges of the cathode and the organic layer by a passivation,
- and/or on an anode edge covered by the light-emitting system (and by the cathode above) and is passivated by a passivation layer, such as polyimide, therefore (at least in part) at the periphery internal to the active zone.

The first external peripheral tailored contact and/or the optional second external peripheral tailored anode contact or contacts are preferably at a distance W of less than L/10 or indeed than L/20 from the closest edge of the active zone.

Preferably the first tailored contact which is peripheral (like the optional second peripheral tailored anode contact or contacts) lies alongside the periphery (internal or external) of the active zone, and is a constant (or nearly so) distance from the periphery of the active zone.

The first peripheral tailored contact, external and/or internal, is preferably at a distance of less than 10 mm, or indeed of less than or equal to 5 mm from the closest edge of the active zone or indeed is (in part) on the edge of the active zone (while protruding from either side).

The optional second peripheral tailored anode contact or contacts of peripheral anode (external and/or internal) are preferably at a distance (preferably constant) of less than 10 mm or indeed than 5 mm from the closest edge of the active zone or indeed are (in part) on the edge of the active zone (while protruding from either side).

The first tailored contact may be on the anode edge.

Preferably, the shape of the first anodic region (in particular if unique region of the anodic surface) corresponds (substantially) to the shape of the active zone or approaches thereto for example formed of a set of rectilinear segments for a round contour.

The first and/or the optional second tailored anode contact(s) (in particular peripheral) can substantially be rectilinear, be curved, etc.

Typically the width of a tailored anode contact (extended or indeed point-like) is of the order of a cm. There is probably no light exiting in the active zone endowed with the first tailored anode contact, since the latter is too opaque.

Moreover, in contradistinction to the aforementioned prior art, an acceptable luminance level is safeguarded, via the reflector. Typically the reflector may have a luminous reflection RL (toward the organic system) of at least 80%.

If the active zone is of hollow type such as a frame or an annulus, the first anode contact is on the outermost contour of the active zone, and it is preferred to place another tailored anode contact on the innermost contour of the active zone. It is possible to define a distance D' between a point B' of this other tailored anode contact and a point C' closest to the cathode contact and a distance L' between the point B' and the point B on the outermost anode contour on passing through C and in a manner similar to D and L and the ratios of D'/L' are defined as a function of r.

More rigorously, D' is the distance between B' and the orthogonal projection of C' in the plane passing through B' parallel to the anode, but having regard to the small height of the OLED, this does not change the criteria defined hereinabove.

And likewise more rigorously, L' the distance between the point B' and B, on passing through the orthogonal projection of C' in the plane passing through B' parallel to the anode but having regard to the small height of the OLED, this does not change the criteria defined hereinabove.

It may therefore be preferred to define D' and L' in the plane passing through B' parallel to the anode.

The organic light-emitting system is above the anode:
in particular directly on the anode, by integrating into the anode function also an electroconducting optional planarization,
or else directly on a passivation of tailored anode contact internal to the active zone (as discussed later),
in particular directly on the anode, by integrating into the anode function also an electroconducting optional planarization,
or else directly on a passivation of resistive anode contact internal to the active zone (as discussed later).

Typically, the substrate clad with the anode (anode directly on the substrate or separated by a layer for example for the extraction of light) may have a luminous transmission of at least 70%.

According to the invention, "thin layer" is intended to mean a layer (mono or multilayer if not specified precisely) of thickness less than a micron, or indeed than 500 nm, or indeed than 100 nm.

According to the invention, "layer" is intended to mean a monolayer or multilayer, if not specified precisely.

For still better homogenization, the following is preferred:
if $0.04 \leq r < 0.1$, then $40\% < D/L < 48\%$
if $0.1 \leq r < 0.5$, then $30\% < D/L < 45\%$
if $0.5 \leq r < 1$, then $20\% \leq D/L \leq 40\%$, or indeed $25\% \leq D/L \leq 35\%$
if $1 \leq r < 1.5$, then $10\% < D/L \leq 35\%$
if $1.5 \leq r < 2.5$, then $15\% \leq D/L \leq 25\%$.

In particular the following criteria are preferred (in particular for a closed or quasi-closed contour of tailored anode contact(s) or a set of spaced extended anode contacts):
$0.1 \leq r < 0.5$, then $30\% < D/L < 45\%$
$0.5 \leq r < 1$, then $20\% \leq D/L \leq 40\%$, or indeed $25\% \leq D/L \leq 35\%$
$1 \leq r \leq 1.5$, then $10\% < D/L < 35\%$.

The first cathode contact may preferably be continuous in the first anodic region, in particular is a metallic solid layer (mono or multilayer), and/or preferably the contact surface is not hollow (at least at the center).

The anode may be contacted by several groups of tailored anode contacts defining the contours of a plurality of anodic regions. In each anodic region, the OLED device can comprise a cathode contact (adjacent to an optional covering element or to a Bragg mirror as detailed later) arranged above said anodic region, of given surface smaller than the surface area of the anodic region, partially covering the region of the cathode above said anodic region and offset from the associated tailored anode contact or contacts at every point C of the contact surface and meeting the criteria already described for D/L as a function of r.

Thus the tailored anode contacts may form a tiling of the anode (therefore of the active zone) with a for example triangular, rectangular, square, honeycomb, etc. mesh.

The anodic regions are of identical or distinct sizes and of identical or distinct shapes.

The OLED device may comprise one or more so-called resistive anode electrical contacts, in particular as an electroconducting layer, arranged in the first anodic region, linked to the first tailored anode contact and/or to the optional second tailored anode contact(s), optionally interconnected resistive contacts.

And the ratio $r = R_2/R_1$ ranging from 0.01 to 2.5 is then replaced with a ratio $r' = R_2/R'_1$ ranging from 0.01 to 2.5 in which R'1 is the equivalent sheet resistance of the anode and resistive contact(s) assembly in the first anodic region and the criteria for D/L are retained.

Naturally the following will be preferred:
if $0.04 \leq r' < 0.1$, then $40\% < D/L < 48\%$
if $0.1 \leq r' < 0.5$, then $10\% < D/L < 45\%$
if $0.5 \leq r' < 1$, then $20\% \leq D/L \leq 40\%$, or indeed $25\% \leq D/L \leq 35\%$
if $1 \leq r' < 1.5$, then $10\% < D/L \leq 35\%$
if $1.5 \leq r' < 2.5$, then $15\% \leq D/L \leq 25\%$.

The resistive contacts are of resistance such that during operation, certain points of the resistive contact are at a potential Vr distinct from the potential of the tailored anode contact by more than 5% as an absolute relation, or indeed at least 10% or even 20%.

The global resistance of the anode may thus be defined as the placing of the resistance of the resistive contacts in parallel with the resistance of the transparent anode layer.

The resistive contact may be of one and the same material as the tailored contact but much finer for example less than 1 mm.

For esthetic purposes, an OLED device may be preferred which is divested of one or more tailored anode contacts in the active zone, or indeed even divested of one or more resistive anode contacts (even if fairly fine in general) in the active zone.

An anode contact (tailored or resistive) may be in the form of a layer of thicknesses lying between 0.2 to 10 µm and preferably in the form of a monolayer of one of the following metals: Mo, Al, Cr, Nb or an alloy such as MoCr, AlNb or in the form of a multilayer such as Mo/Al/Mo or Cr/Al/Cr.

It may also be a silk-screen-printed silver contact (silver enamel) or one deposited by ink jet.

It is already known to reduce R1 of the anode by a fairly fine mesh of resistive electrical contacts, typically a square metallic network or honeycomb on the anode.

The strands are of the order of 50 to 100 µm wide and the pitch of the network is in general ⅕ mm, thus giving an occlusion factor of between 1 and 5%.

R1' can vary from 0.5 to 5 Ohms for example. In practice, use is made of a multilayer Mo or Cr (100 nm)/Al (500 nm to 1000 nm)/Mo or Cr (100 nm) is deposited for example on the ITO of 140 nm. This multilayer is thereafter chemically etched, with a photolithography method in general, to form the resistive contacts and optionally the tailored anode contacts in the same substance but wider.

Thus in the anodic region, everything happens as if there were an anode of resistance equivalent to placing the anode and the resistive anode contact or contacts in parallel.

There is then a voltage in the resistive anode contacts which will decrease progressively on moving away from the edges of the OLED.

It may be preferred to position the connection arrangement of the anode outside of the active zone; this is why the connection arrangement (linked with the peripheral tailored anode contact) is placed in an anode contact zone protruding from the active zone.

It may be preferred to position the connection arrangement of the cathode outside of the active zone; this is why the connection arrangement linked with the cathode contact is placed in a "cathode contact" zone protruding from the active zone.

In the same manner, there may be one or more cathode resistive contacts, for example as an electroconducting layer, linked to the first cathode contact, resistive contacts optionally interconnected and in particular distributed over the whole of the zone between the first cathode contact and the edges of the OLED.

In this case, R2 corresponds to the equivalent sheet resistance of the cathode and resistive contact(s) assembly.

The resistive contacts are for example of resistance such that during operation, certain points of the resistive contact are at a potential Vr distinct from the potential of the first cathode contact V by more than 2% as an absolute relation, or indeed at least 4% or even 8%.

The first tailored anode contact alone or with the second tailored anode contact(s) a closed or quasi-closed contour delimit all or part of the first anodic region, contour optionally supplemented with one or more edges of the active zone (or edge of anode zone without anode contact more precisely).

And, in a first preferred embodiment, the first tailored anode contact extends and forms alone or with the second tailored anode contact(s) a closed or quasi-closed contour in particular leaving at least one opening for example to effect a cathode connection arrangement.

"Quasi-closed contour" is intended to mean a contour covering at least 70%, or indeed 80% or even at least 90% of the contour of the first anodic region.

For example the length of a zone without tailored anode contact is for to example of restricted size, in particular less than 5 cm, or indeed 1 cm (for example for active zone dimension of at least 10 cm). It may likewise have several restricted openings.

Preference is given in particular to a square, rectangular or round active zone with said quasi-closed contour and the aforementioned ranges of D/L as a function of r or r'.

In particular, when the first tailored anode contact (internal and also external) is peripheral to the active zone, one or more zones without (tailored or resistive) anode contact supplement the contour of the first anodic region. In this anode contact free zone, it is possible to thus supply the cathode:
  by making the cathode contact overhang out of the active zone, via one of its ends, this zone no longer being defined as a cathode contact zone but as a cathode connection arrangement zone
  or by making the reflector overhang out of the active zone on one side.

Thus there may be for example:
  a first and single band forming the first tailored contact with an opening
  a first band forming the first tailored contact and other bands (for example one per edge), bands separated by 1, 2, 3, 4, etc. or indeed X openings for example at the 1, 2, 3, 4, etc. or indeed X corners of the first anodic region with corners (from the triangle to the honeycomb for example).

With a closed or quasi-closed contour of tailored anode contact(s), the first cathode contact may be (substantially) centered with respect to the edges of the first anodic region (or indeed preferably with respect to the edges of the active zone if external tailored anode contact(s)).

The first cathode contact has for example a contact surface whose contour is orthogonal to the current lines in the first anodic region, in particular in a square or rectangular configuration.

Preferably with a closed or quasi-closed contour of tailored anode contact(s), the first cathode contact, in particular centered, can have a surface (substantially) homothetic to the surface of the first anodic region, or indeed of the active zone if external tailored anode contact(s).

At the very least the contour of the points of the contact surface that are closest to the first extended tailored anode contact can follow the shape of the first extended tailored anode contact or else the shape of the contour of the active zone.

The ratio r (or r') can be tailored as a function of the geometry of the anode and cathode contacts or vice versa; there also exists an optimal contact surface (size and even geometry), for given r or r'.

Preference is given in particular to a square or rectangular or round active zone with said quasi-closed contour, forming a homothetic surface and the aforementioned ranges of D/L as a function of r or r'.

Preferably with a closed or quasi-closed contour of tailored anode contact(s), the first anodic region can be a square or a rectangle, the first cathode contact is cross-shaped, centered, cross oriented along the diagonals of the first anodic region (or of the active zone) for example to within ±5°, and the ratio r (or r') is equal to 1.1±0.1.

Naturally, it is possible to deviate from a cross in the strict sense (four orthogonal rectangular segments) for example to employ a rosette with four branches.

With a closed or quasi-closed contour of tailored anode contact(s), there furthermore exists an optimal contact surface for a disk-shaped central contact on the cathode, as well as an optimal R2 (with R1 given).

For too small a contact surface on the cathode, the current density in the cathode is very large near the contact (since the whole of the current is concentrated toward the contact to exit the device to ground), therefore the voltage drop is very significant in the cathode in proximity to the contact, thus giving rise to further homogeneity.

For an intermediate contact surface, the voltage drop in the cathode compensates the voltage drop in the anode, and the homogeneity is better than in the two extremal cases (small surface or complete surface, that is to say regarded as an ideal cathode).

The optimum is independent of the size of the OLED and of the resistance of the organic layer.

Hence, if the first tailored anode contact forms a closed or quasi-closed contour, the first anodic region is disk-shaped, the first cathode contact is centered and is preferably a disk, with $1 \le r$ (or $r'$)<1.5 and 20%<D/L$\le$30%.

In a (quasi) closed contour configuration in particular, the more that r (or r') is increased, the more necessary it is to increase the contact surface.

For polygons approximating a disk (for example on the basis of 6 or indeed 8 sides), this "disk" solution is particularly suitable.

In one embodiment of the invention with multiple tailored and spaced anode contacts, the first tailored anode contact can be an extended contact (band etc.), and at least two of the second tailored anode contacts are of extended type and it is preferred that Lp<0.25P or indeed $\le$0.15P, with Lp the distance between each extended tailored contact and P the perimeter of the first anodic region.

Naturally, it is possible to add point-like tailored anode contacts between extended anode contacts.

Preferably, the extended contacts are regularly distributed.

In one embodiment of the invention with multiple tailored and spaced anode contacts, the first tailored anode contact is a contact of point-like type, the second tailored anode contacts of point-like type are distributed so as to delimit the first anodic region, in particular are present facing each active zone edge, and the distance between each tailored point-like contact is less than half the maximum distance Lmax of the first anodic region, or indeed than Lmax/4, or indeed than Lmax/8.

It is indeed preferred that the point-like anode contacts not be spaced too far apart.

Preferably, the point-like contacts are regularly distributed.

Naturally, it is possible to mix point-like tailored anode contacts and extended anode contacts.

Moreover, on account of the tailoring of R2, the cathode can be transparent or semi-reflecting, in particular of reflection RL less than 80%, or indeed less than or equal to 60%, or indeed 50%.

The cathode allows the emitted light to pass through, preferably without absorbing too much.

In a first configuration (with the transparent or semi transparent cathode), the reflector can comprise a metallic reflecting covering element, in particular (thin) layer(s), above the cathode on moving away from the first main face, the covering element being separated from the cathode by an electrical insulating element, in particular layer-like, a so-called insert.

The first cathode contact, adjacent to the insert (and at least partially surrounded by the insert), can also form part of the reflector and is preferably in contact or indeed electrically coupled with the reflecting covering element.

The reflecting covering element may be:
a layer, deposited by physical vapor phase deposition on the insert, or on an inner face of a counter-element (glass, plastic film, etc.) overlaid against the insert (in optical contact preferably)
a metallic sheet: Cu, stainless steel, Alu, Ag etc.

The reflecting covering element, preferably layer-like, is for example based on at least one metal chosen from among Al, Ag, Cu, Mo, Cr.

The insert can be chosen to allow the emitted light to pass through, preferably without absorbing too much. For example the insert is transparent, preferably of TL>90%, and quite non-absorbent in particular A<3%.

The insert may be:
a layer deposited on the thin layer cathode deposited by physical vapor phase deposition, or indeed a glue if the reflector is a plate (stainless steel etc.) etc.
air, the reflector being separated by spacers, peripheral to the active zone,
an overlaid film, for example a lamination insert (PVB type), and the reflector is for example a glass substrate with a reflecting layer.

The insert preferably comprises or indeed consists of a (mono)layer (in particular of thickness less than 100 nm, thickness adjusted as a function of its absorption) which is
mineral, preferably chosen from among a nitride, an oxide, an oxynitride, for example a silicon nitride,
or a resin for example identical to the resin for passivating the OLED edges, in particular of polyimide,
and/or optionally is diffusing for example by addition of diffusing particles, in particular mineral, in a binder, in particular mineral.

Preferably, in this first configuration, the first cathode contact comprises a layer based on the same material as the metallic covering element, preferably which is a layer based on aluminum.

The cathode contact may be:
a layer deposited on the cathode: conducting glue, layer deposited by ink jet or silk-screen printing according to the form desired, thin layer deposited by PVD and if necessary patterned, a soldered joint or indeed a weld etc.
and/or an overlaid film with the predetermined form: foil leaf etc.

The cathode contact, preferably layer-like, is based on at least one metal preferably chosen from among Al, Ag, Cu, Mo, Cr.

In particular, the cathode contact and the reflecting covering element can be formed by a continuous layer on the insert (layer-like) and the cathode, and preferably the cathode contact, or indeed the continuous layer, is based on the same material as the cathode, in particular aluminum.

In this manner in the off state, the continuous layer can form a mirror and the cathode contact is not differentiated from the covering element.

It may be desired to use a single deposition technique (for example physical vapor phase PVD, in particular cathodic sputtering or evaporation) for the covering element and the cathode contact (and even the cathode or else the insert), or indeed even a single step of layer deposition for the covering element and the cathode contact.

More broadly, among the possible materials for the cathode may be cited
metals: aluminum, beryllium, magnesium, calcium, strontium, barium, lanthanum hafnium, indium, bismuth, and lanthanides: cerium, praseodymium, neodymium, samarium, europium, gadolinium, terbium, dysprosium, holmium, erbium, thulium, ytterbium, and lutetium.

Preferred in particular are aluminum, silver, barium, calcium, samarium which are often used for their low work function.

Table 1 hereinbelow gives
- the R2 of the aluminum (which may be transparent or semi transparent as a function of the chosen thickness),
- the R2 of the samarium, of resistivity (per unit mass) of 900 nOhm·m, which may be transparent or semi transparent as a function of the chosen thickness and
- the R2 of the barium, of resistivity (per unit mass) of 332 nOhm·m, which is transparent or semi transparent as a function of the chosen thickness.

TABLE 1

| Thickness (nm) | R2 (Ω/□) for Al | Thickness (nm) | R2 (Ω/□) for Ba | Thickness (nm) | R2 (Ω/□) for Sm |
|---|---|---|---|---|---|
| 10 | 5 | 5 | 66 | 10 | 90 |
| 20 | 2.5 | 10 | 33 | 50 | 18 |
| 50 | 1 | 30 | 11 | 100 | 9 |
| 100 | 0.5 | 50 | 6 | 200 | 4.5 |
| 200 | 0.25 | 75 | 4 | | |
| 500 | 0.1 | 100 | 3 | | |

It is preferred that R2 be greater than or equal to 1 or indeed 3 ohm/square and less than 20 ohm/square.

In a preferred manner, the cathode is based on at least one metal, preferably chosen from among Al and Ag, with optionally a layer of LiF subjacent to the metal layer and for example of thickness<3 nm.

Most particularly the cathode can comprise, or indeed is constituted of, a layer based on aluminum and the cathode contact is a layer based on aluminum, forming for example a thickening on the aluminum cathode layer.

In a second configuration (with the transparent or semi transparent cathode), the reflector is a Bragg mirror, Bragg mirror arranged on the cathode and adjacent to the cathode contact, and the cathode contact forms part of the reflector.

The Bragg mirror is known as a stack formed of an alternation of thin layers of high refractive index n1, such as TiO2, ZrO2, Al2O3, Si3N4, and of thin layers of lower index n2, such as SiO2, CaF2.

For example the delta of index n2-n1 is at least 0.3, and preferably at least 0.6, and the stack comprises at least two high-index layers and two low-index layers.

Thus, for an OLED of wavelength centered near 570 nm, it will be possible to envisage a multilayer stack TiO2 60 nm/SiO2 95 nm, or indeed optionally the superposition of this multilayer stack.

The use of Bragg mirrors for OLEDs is well known to the person skilled in the art, who will optionally be able to refer to the following publications:

Appl. Phys. Lett. 69, 1997 (1996); Efficiency enhancement of microcavity organic light emitting diodes; R. H. Jordan, A. Dodabalapur, and R. E. Slusher JOSA B, Vol. 17, Issue 1, pp. 114-119 (2000), Semitransparent metal or distributed Bragg reflector for wide-viewing-angle organic light-emitting-diode microcavities; Kristiaan Neyts, Patrick De Visschere, David K. Fork, and Greg B. Anderson.

The cathode contact may touch the Bragg mirror.

The cathode contact is connected for example by one of its ends protruding from the active zone then forming a cathode connection arrangement zone.

The invention also proposes a method for homogenizing the luminance of a back-emitting organic light-emitting device with a transparent substrate with a first main face comprising a stack comprising in this order, starting from said first face:
- a lower electrode forming an anode, which is transparent, preferably comprising at least one electroconducting layer, anode of given sheet resistance R1, in particular R1 less than 30 Ohm/square, or indeed less than or equal to 15 Ohm/square or even 10 Ohm/square,
- an organic light-emitting system above the anode,
- an upper electrode forming a cathode, above the organic light-emitting system, preferably comprising an electroconducting layer, cathode of given sheet resistance R2 and preferably of constant given thickness,
- the anode, the organic light-emitting system and the cathode thus defining a, so-called active, common zone.

The method comprising:
- at least one anode electrical contact, termed the first tailored anode contact,
- at least one first cathode electrical contact, termed the first cathode contact, the method comprising the adjusting of the ratio r=R2/R1 from 0.01 to 2.5 and the positioning of the cathode contact above the active zone, in particular the zone or zones furthest away from the edges of the active zone, and the choosing of the size of the contact surface so as to obtain a luminance homogeneity H of the active zone of greater than or equal to 5%, or indeed 10% to that of an OLED device differing through the choice of an aluminum cathode of 100 nm (intrinsically forming the cathode contact over the whole of the surface of the active zone).
- the addition of a reflector above the cathode, in particular by inserting said insert adjacent to the cathode contact, as already aforementioned.

A ratio r (or r') of 0.1 (or 0.5) to 2.5 or indeed to 1.5 is furthermore preferred.

The invention will now be described in greater detail with the aid of nonlimiting examples and of figures:

FIG. 1 is a sectional schematic view of an organic light-emitting device in accordance with the invention, FIG. 2a illustrates a schematic view from above of the OLED device of FIG. 1, showing the anode and cathode contacts, FIG. 2b illustrates a schematic view from above of the OLED device of FIG. 1 in a first variant, FIG. 2c illustrates a schematic view from above of the OLED device of FIG. 1 in a second variant, FIG. 3a and 3b are sectional schematic views of an OLED device showing the connection arrangement of the cathode, FIG. 4 is a sectional schematic view of an OLED device in accordance with the invention, FIG. 5 illustrates a schematic view from above of the OLED device of FIG. 4, showing the anode and cathode contacts, FIG. 6 illustrates a schematic view from above of an OLED device with several anodic regions and cathode contacts, FIG. 7 illustrates a schematic view from above of the OLED device of FIG. 6, showing the anode and cathode contacts, FIGS. 8-10 each illustrate a schematic view from above of the OLED device, showing the anode and cathode contacts with active zones of various shapes, FIG. 11 shows luminance homogeneity graphs obtained by the invention, and FIGS. 12, 13a-d and 14-16 each illustrate a schematic view from above of the OLED device, showing the anode and cathode contacts with active zones of various shapes.

It is specified that for the sake of clarity the various elements of the objects (including the angles) represented are not reproduced to scale.

FIG. 1, intentionally very schematic, represents in section an organic light-emitting device with emission through the substrate or "bottom emission".

The OLED device 1000 comprises a transparent substrate with a first main face 10 comprising a stack comprising in this order, starting from said first face:
- a lower electrode forming an anode 1, which is transparent, comprising at least one electroconducting layer, anode of given sheet resistance R1, for example a TCO or a silver-based stack,
- an organic light-emitting system 2 above the anode, (including layer HTL and ETL),
- an upper electrode forming a cathode 3, transparent or semi reflecting, above the organic light-emitting system, comprising an electroconducting layer, cathode of given sheet resistance R2 of constant given thickness, the ratio r=R2/R1 being between 0.01 and 2.5, the stack thus defining a, so-called active, common zone 20.

A potential V, for example 4 V or 10 V, is applied at the boundary of the anode 1 via a first peripheral anode electrical contact 41, metallic (multi)layers for example. It is termed the first tailored anode contact 41, that is to say of electrical resistance tailored so as to be, during operation, at the first potential V at every point.

The first tailored contact 41 is here a continuous band, outside the active zone 20 delimiting alone an external, quasi-closed contour of a first region of the anode surface termed the first anodic region 40.

The invention thus consists of an OLED module of which both the ratio r and the geometry of the electrical connections on the two electrodes are adjusted in such a way that the voltage drops which take place in the two electrodes compensate one another so as to maintain the most uniform possible voltage difference between the two electrodes.

Hence, a first cathode electrical contact 5, for example layer-like, is arranged above the active zone 20 and above the central zone of the first anodic region 40, of given surface, termed the contact surface, smaller than the surface area of the anodic region 40 (and of the active region 20). The contact surface therefore extends from the center of the first anodic region to the edges of the active zone.

The cathode contact 5 is offset from the first anode contact 41 and partially covers the region of the cathode 3 above the first anodic region 40 at every point C1 of the contact surface.

For each point B of the first tailored anode contact and of each optional second tailored anode contact, the point B being in a given edge of the first anodic region, on defining a distance D between said point B and the point C closest to said point B, and on defining a distance L between said point B and a point X of an opposite edge of the first anodic region from the first edge, passing through C then:
- if $0.01 \leq r < 0.1$, then $30\% < D/L < 48\%$,
- if $0.1 \leq r < 0.5$, then $10\% < D/L < 45\%$,
- if $0.5 \leq r < 1$, then $10\% < D/L < 45\%$,
- if $1 \leq r < 1.5$, then $5\% < D/L < 35\%$,
- if $1.5 \leq r < 2.5$, then $5\% < D/L < 30\%$.

or better still
- if $0.04 \leq r < 0.1$, then $40\% < D/L < 48\%$,
- if $0.1 \leq r < 0.5$, then $30\% < D/L < 45\%$,
- if $0.5 \leq r < 1$, then $20\% \leq D/L \leq 40\%$, or indeed $25\% \leq D/L \leq 35\%$,
- if $1 \leq r < 1.5$, then $10\% < D/L \leq 35\%$,
- if $1.5 \leq r < 2.5$, then $15\% \leq D/L \leq 25\%$.

More rigorously, D is the distance between B and the orthogonal projection of C in the plane passing through B parallel to the anode. And L the distance between B and X, on passing through the orthogonal projection of C in the plane passing through B parallel to the anode. It is therefore preferred to define D and L in the plane passing through B parallel to the anode.

In FIGS. 2a, 2b, 2c, 5, 7, 8, 9, 10, 12, 13a to 13d, 14 to 16 are represented by way of illustration points B1, B2, B3, the points C1, C2, C3, the points X1, X2, X3 and the associated distances L1, L2 or L3 and D1, D2 or D3. More precisely the distances are defined in the plane passing through B1 or B2 or B3 parallel to the anode and the orthogonal projections of C1, C2, C3 in this plane passing through B1 or B2 or B3 are considered.

The contact surface is here a solid surface; as a variant it is grid-like. The surface is optionally star-like.

The OLED device 100 comprises above the organic light-emitting system 2, on moving away from the first face, a reflector 6 covering the active zone.

More precisely, the reflector 6 comprises a metallic reflecting covering element 61, above the cathode 3 on moving away from the first main face, the covering element 61 being separated from the cathode 3 by an electrically insulating electrical element 7, a so-called insert, transparent and quite non-absorbent, here a layer preferably mineral and thin, such as 50 nm of silicon nitride.

The first cathode contact 5, adjacent to the insert 7, is reflecting, therefore forms part of the reflector 6 and is preferably in contact or indeed electrically coupled with the reflecting covering element 61.

In FIG. 1, the cathode contact 5 is based on the same material as the metallic covering element 61. The cathode contact 5 and the covering reflector 6 are formed by a continuous layer on the insert 7 and the cathode 3 for example by physical vapor phase deposition. Preferably this continuous layer is based on aluminum for example 100 nm, or indeed 500 nm in thickness. Naturally the insert 7 has been structured before the deposition so as to leave a free zone corresponding to the zone intended to be the zone of the cathode contact. The edges of the active zone 20 are for example passivated by polyimide resin for example 71.

The anode contact 41 is here on the anode 1 therefore deposited previously on the substrate (or on a subjacent layer). However, the anode 2 may equally well be deposited after the anode contact 41 and overlap it partially for its electrical bonding. This does not change the definition of the first anodic region 40.

As a variant, not represented, the reflector comprises a Bragg mirror adjacent to said first cathode contact. The, reflecting, cathode contact then still forms part of the reflector. The Bragg mirror (of dielectric materials) may be directly on the cathode.

The cathode 3 is for example an aluminum layer, in particular of R2 greater than or equal to 1 ohm/square, or indeed greater than or equal to 3 ohm/square and less than 20 ohm/square or indeed than 10 ohm/square; the cathode contact is then preferably a layer based on aluminum, as already indicated.

The first anodic region 40 (and therefore the active zone 20) is for example at least 5 cm by 5 cm.

FIG. 2a illustrates a schematic view from above of the device 100 showing a part of the elements of the device for greater clarity, namely the elements with electrical function.

The first tailored anode contact 41 is a band delimiting the first anodic region 40 which is square (or as a variant not shown several bands for example rectilinear delimiting a square).

The active zone 20 (defined here simply by its contours, dashed) is likewise square, is internal to the first anodic region 40. Practically the space between the first anodic region 40 and the active zone 20 is restricted. The first external peripheral tailored contact is preferably at a distance W of less than La/10 or indeed than La/20 from the closest edge of the active zone 20 where La is the maximum dimension of the active zone for example.

The first anode contact is single and delimits a quasi-closed contour, here covering 95% of the contour of the first anodic region 40 (and of the active zone 20).

An opening 4' in the middle of the upper edge serves for the cathode connection arrangement zone 52. The length of this zone without tailored anode contact is for example of restricted size in particular less than 1 cm.

As a variant, not shown, the first cathode contact 5 can extend up to the edge zone of the active zone (here to the center of the upper edge) which does not comprise any tailored anode contacts 4, if the prerequisite ratio D/L according to the invention is unchanged (in particular for the points of anode contacts at the ends).

The first cathode contact 5 (defined here simply by its contours) is centered with respect to the edges of the first anodic region 40, for example a square and edges of the active zone 20.

We choose La=15 cm, Rorg=300 Ohm·cm$^2$, an anode of 3 Ohm/square, and we present in table 2 hereinbelow the homogeneity H of the luminance H (the homogeneity H is defined as the ratio between the minimum luminance over the maximum luminance for an OLED supplied at a given voltage above the OLED turn-on voltage) as a function of the sheet resistance of the cathode R2 and of the ridge Lc of the square cathode contact and of its distance D from the first tailored anode contact.

TABLE 2

|  | R2 | r | D | Lc | H |
|---|---|---|---|---|---|
| A | "Ideal" | 0 | 0 | L | 85.1% |
| Counter-example 1 | 10 | 3.5 | 0.25 L | 0.5 L | 74.3% |
| Counter-example 2 | 3 | 1.1 | 0.45 L | 0.1 L | 61% |
| Counter-example 3 | 3 | 1.1 | 0.375 L | 0.25 L | 79.8% |
| 1 | 1 | 0.35 | 0.25 L | 0.5 L | 87.8% |
| 2 | 3 | 1.1 | 0.25 L | 0.5 L | 93.2% |
| 3 | 5 | 1.7 | 0.25 L | 0.5 L | 88.8% |
| 4 | 3 | 1.1 | 0.3 L | 0.4 L | 89.4% |
| 5 | 3 | 1.1 | 0.15 L | 0.7 L | 87.6% |

Example A corresponds to an ideal cathode. It is appreciated that in order to increase H it is preferable to finely adjust both the pair r and D/L. Thus even with an r of around 1, it is possible to degrade the homogeneity H in particular if the contact surface is too small (D/L too large), as indicated by counter-examples 2 and 3. The best homogeneity is for r around 1.1 and D=0.25 L (example 2). Counter-example 3 illustrates the lack of homogeneity for r greater than 3.5.

For better effectiveness an R1 of preferably less than 5 ohm per square is chosen.

To produce an anode of R1 equal to 3 ohm per square, a silver-based stack is preferred to a transparent conducting oxide 'TCO' such as ITO. It is possible to cite for example the silver-based monolayer or silver-based bilayer stacks described in applications WO 2008/029060 and WO 2009/083693.

To produce a cathode of R2 equal to about 3 ohm per square, aluminum is deposited while adjusting the thickness.

The results for H are similar (follow the same trend) with a different Rorg, typically between 50 and 300 Ohm·cm$^2$, an anode of different R1 typically between 1 and 10 ohm per square, and for any other size of active zone.

In a first variant shown in FIG. 2b, illustrating a view from above of the OLED, the first cathode contact 5, still centered, is cross-shaped, along the diagonals of the square of the first anodic region 40.

The homogeneity results are the best for r equal to 1.1.

The opening 4' for the cathode connection arrangement zone 52 is for example in a corner. There may be other openings not used at other corners for example.

In a second variant shown in FIG. 2c, illustrating a schematic view from above of the OLED, resistive anode electrical contacts 42, electroconducting layer-like, are added in the first anodic region 40 and linked to the first tailored anode contact 41.

Here these resistive contacts 42 are interconnected and form a grid.

Hence to obtain good homogeneity of illumination, the ratio r ranging from 0.01 to 2.5 is replaced with a ratio r'=R2/R'1 ranging from 0.01 to 2.5 in which R'1 is the equivalent sheet resistance of the anode/resistive anode contact(s) assembly in the first anodic region, that is to say the placing in parallel of the anode and of the resistive anode contacts.

The resistive anode contact may be made of one and the same material as the tailored contact but much finer for example of under 1 mm. For example, a square mesh of metallic strands of a period of 5 mm, produced with the aid of aluminum wires 500 nm in height and 100 µm in width, forms a system having an equivalent sheet resistance of 2.7 ohm per square. If such a mesh is placed on an ITO anode of sheet resistance 20 ohm per square, the equivalent resistance of the anode (defined as the resistance resulting from the placing in parallel of the anode and of the resistive contacts) is then 2.4 ohm per square. By producing on this anode an OLED of square active zone of 8×8 cm$^2$, having a vertical resistance of the organic materials of 100 ohm·cm$^2$, the illumination will be in proximity to a resistive contact situated 4 cm from the edge of the OLED will be 20% lower. This illumination decrease of greater than 5% is attributed to the resistive character of the resistive contacts which bring about a decrease in the voltage of the anode at the center of the OLED, bringing about the drop in illumination.

It has already been observed that the contour of the first anodic region 40 is quasi-closed and a cathode connection arrangement zone 52 has been defined.

As shown in FIG. 3a, which is another schematic sectional view of the OLED of FIG. 1, in fact, the layer forming the reflector 6 is made to overhang in a zone of the first face 10 without anode contact (zone of the opening).

As shown in FIG. 3b, which is another schematic sectional view of the OLED of FIG. 1 in a variant, in fact, the layer forming the reflector 6 is made to overhang in a zone of the first face 10, which is then insulated by the passivation 71, above the anode contact 41, passivation extending over the rim of the anode 1.

It is also possible to make the end of the cathode contact 5 overhang beyond the active zone 40 in the zone without tailored anode contact.

FIG. 4 shows an OLED device 200 in a variant of the first embodiment of the invention and differing in that the first tailored anode contact 41 is under the light-emitting system 2. The first anode contact 41 is passivated by resin 71.

As shown in FIG. 5, one of the ends of the tailored anode contact 41 can protrude from the active zone for the anode connection arrangement 44.

FIG. 6 shows an OLED device 200 in a second embodiment of the invention and differing from the first embodiment in that the first tailored anode contact 41 is not only at the periphery. The first tailored contact 41 in fact defines two anodic regions 20, for example rectangular and of equal area, together comprising the active zone, for example square (preferably anodic region and active zone are of similar shape).

Hence the first tailored anodic contact comprises as a supplement a (passivated) tailored inner band 41 going from a first edge (here longitudinal) to a second here longitudinal opposite edge as shown in FIG. 7 which is a view from above of the device 200.

For the homogeneity of the whole of the active zone 20, we proceed in the second anodic region as in the first anodic region: addition of the second cathode contact and positioned according to the invention. The insert and the covering element are modified accordingly. The choice of r and therefore D/L is retained in each anodic region.

There is an opening 4' per anodic region 40 for the cathode connection arrangement zone 52 for example in a corner or an edge.

Naturally a variant, not shown, consists in the anode contact being at the inner periphery.

If resistive anode contacts are added, preferably some are placed in each anodic region.

It is not necessary for all the anodic regions to have the same shape for which the position, the geometry and even r may vary from one region to another. This gives rise in the limit, to a cathode of piecewise constant thickness (per anodic region).

In all cases it is preferred to supply at V the edges of the whole of the active zone 20 (to within the zones of openings 4').

In a variant, shown in FIG. 8, with anodic multiregions, the device 300 comprises a square active zone 20, there are two triangular anodic regions 40 formed by anode contacts 41 and tiling the active zone 20 (a contact being along the diagonal of the active zone).

The first and second cathode contacts 5 are triangular (shape homothetic to the associated anodic region).

FIG. 9 shows an OLED device 400 in a fourth embodiment of the invention and differing from the first embodiment in that the active zone 20 is a disk, the first anodic region 40 is a disk.

With rorg=300 Ohm·cm², a diameter L1 of 15 cm of the active zone, R1=3 Ohm, table 3 indicates the homogeneity H as a function of the size of the cathode contact Rc or of D1/L1 and as a function of R2.

TABLE 3

|   | R2 | r | D1/L1 | Rc | H |
|---|---|---|---|---|---|
| A' | Ideal | 0 |   | / | 60.7% |
| Counter-example 1' | 3.75 | 1.25 | 0.45 | 0.1 L | 31.1% |
| Counter-example 2' | 3.75 | 1.25 | 0.375 | 0.25 L | 53.2% |
| 1' | 1 | 0.33 | 0.25 | 0.5 L | 67.9% |
| 2' | 3 | 1 | 0.25 | 0.5 L | 83% |
| 3' | 3.75 | 1.25 | 0.25 | 0.5 L | 85.1% |
| 4' | 6 | 2 | 0.25 | 0.5 L | 72.7% |
| 5' | 3.75 | 1.25 | 0.3 | 0.4 L | 73.6% |
| 6' | 3.75 | 1.25 | 0.15 | 0.7 L | 69.2% |

The optimal span of parameters, that is to say r=1 or r=1.25 with D1/L1=25%±5%, is deduced from this table.

FIG. 11 shows graphs of homogeneity H as a function of D1/L1 for the device 400 shown in FIG. 9, for various ratios r (between 0.1 and 2).

Depicted are 6 curves F1 to F6 of homogeneity H (in %) respectively for r=0.1; r=0.3; r=0.5; r=1; r=1.25; r=2.

These graphs recall the suitable parameter spans, in particular r=1 or r=1.25 D1/L1=25%±5%.

We choose for example a silver-based stack of R1 at 3 Ohm/square as anode and a cathode of R2 at 3.75 Ohm/square.

In a variant, we choose for example ITO of R1 at 8 Ohm/square as anode and a cathode of R2 at 10 Ohm/square.

As an alternative shown in FIG. 10, the solid contact surface is replaced with a star-like surface with thick primary central segments and finer secondary segments fanning out bundle-like.

FIG. 12 shows an OLED device 500 in a fifth embodiment of the invention and differing from the first embodiment in that the first tailored anode contact 41 is a contact of point-like type (but could remain extended as a variant for example on a single edge), and eleven other tailored anode contacts 4$i$ of point-like type, are added, are distributed so as to delimit the first anodic region 40 in particular present on each anodic region edge.

The distance between each tailored point-like contact 4$i$ is preferably less than half the maximum distance Lmax between two opposite edges, or indeed than Lmax/4 or Lmax/8.

FIGS. 13a to 13d illustrate other examples of OLED 600 of anodic regions and of cathode contacts 5 of shape which are homothetic or similar.

In the aforementioned examples the active zone and the first anodic region are of the same shape (geometric for example):
quadrilateral (figure a),
hexagon (figure b),
octagon (figure c),
pentagon (figure d).

The cathode contact has the shape of the first anodic region and approaches for example a roundel for the octagon.

The first extended tailored anode contact 41, and two second extended tailored anode contacts 41 are along non-adjacent edges of the active zone 21, 22, 23.

Preferably Lp<0.25P or indeed ≤0.15P, with Lp the distance between each extended tailored contact and P the perimeter of the first anodic region 40 defined as linking these contacts. Here the cathode contact is triangular going as far as the edges 21', 22', 23' of the active zone without anode contacts.

Figure 1:
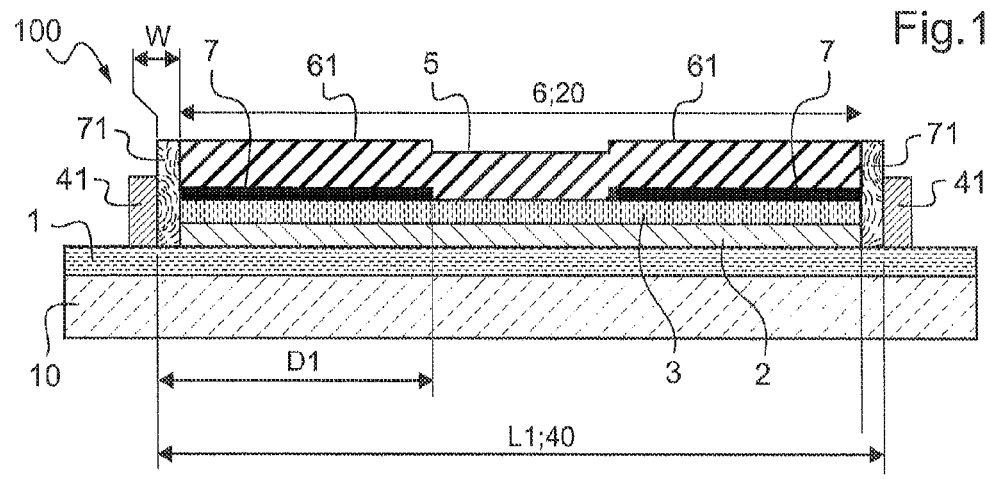
Figure 2A:
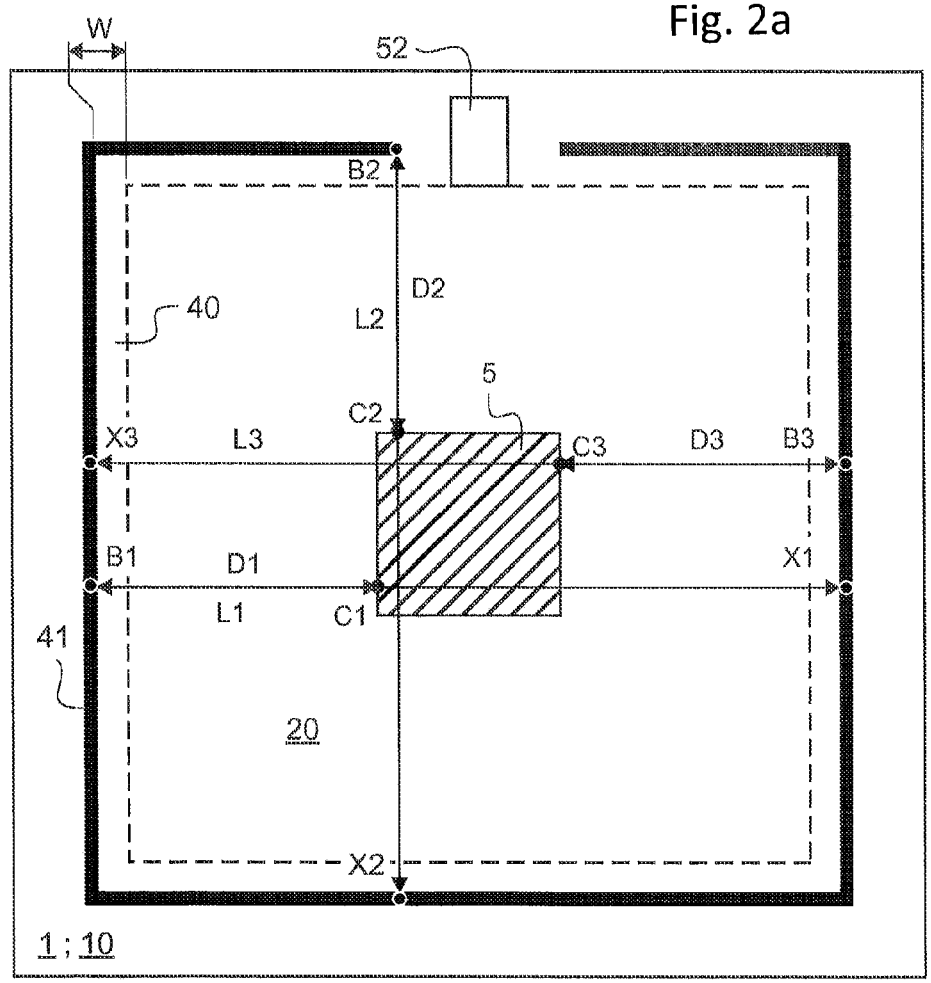
Figure 2B:
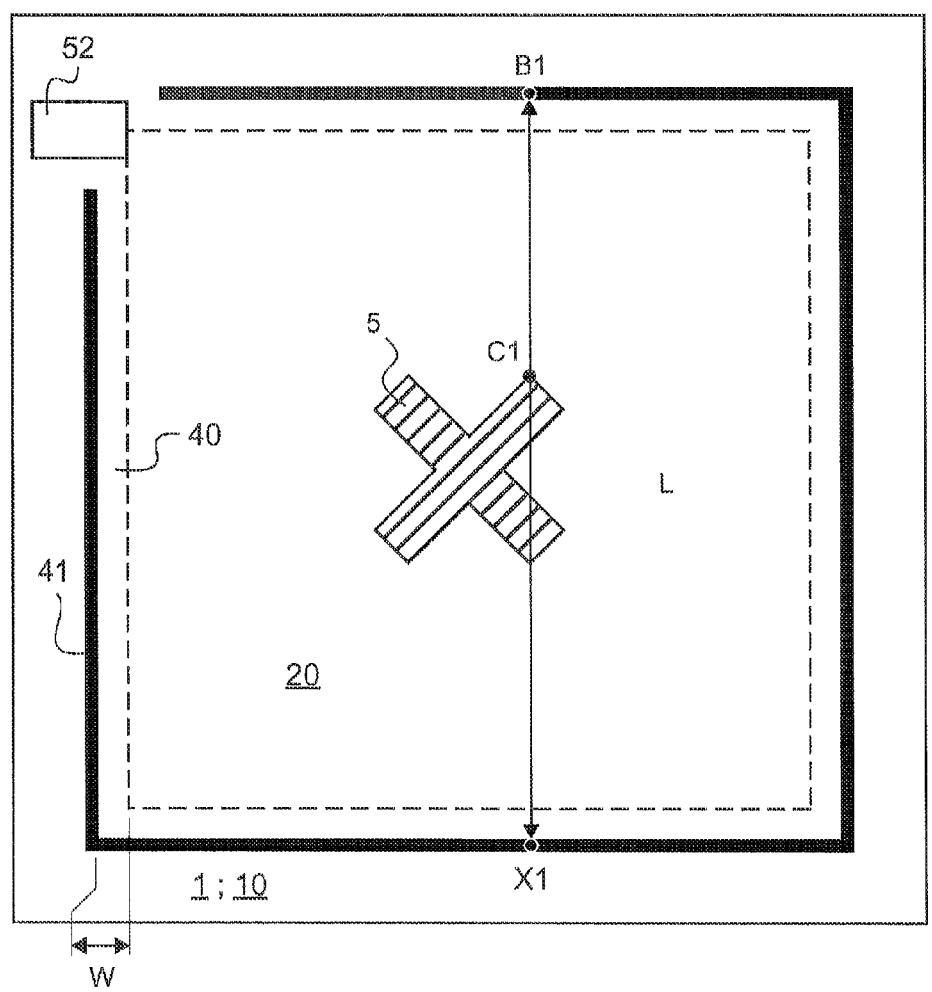
Figure 2C:
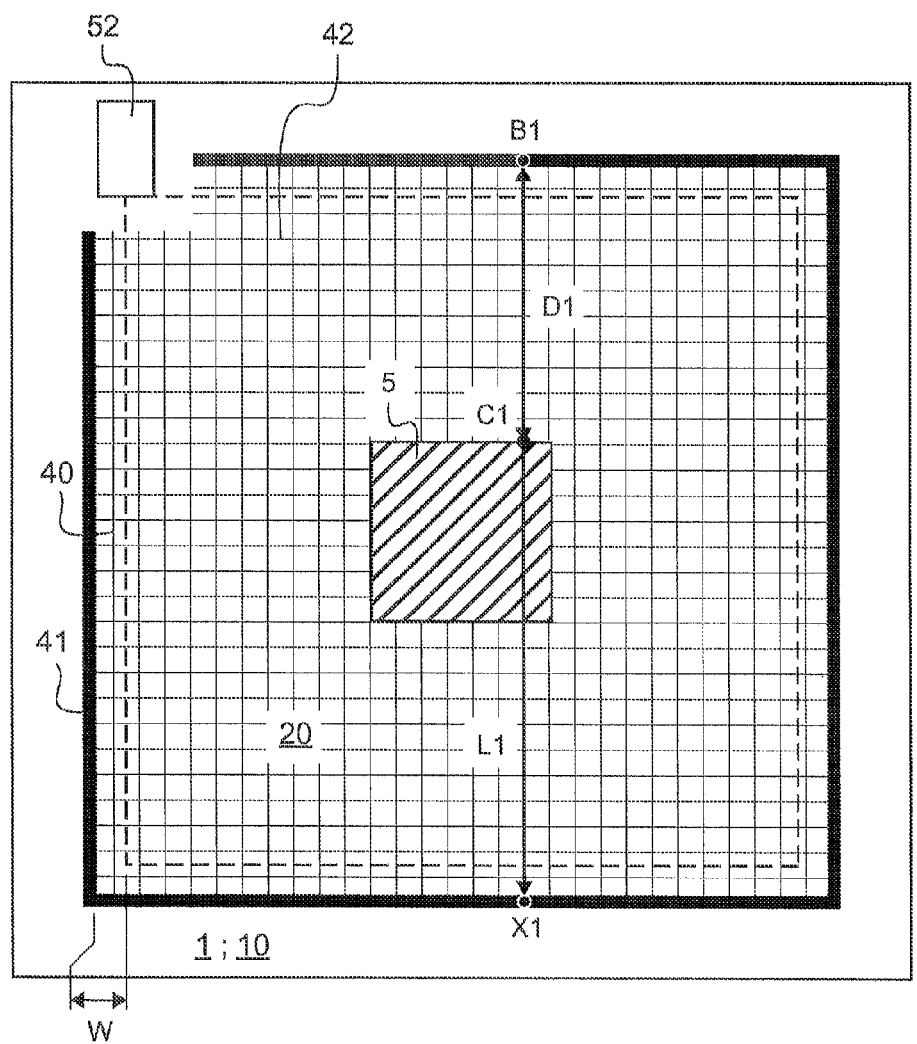
Figure 3A:
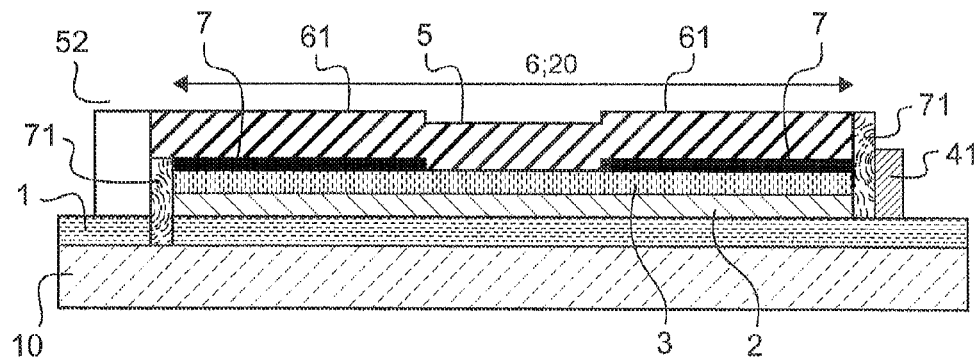
Figure 3B:
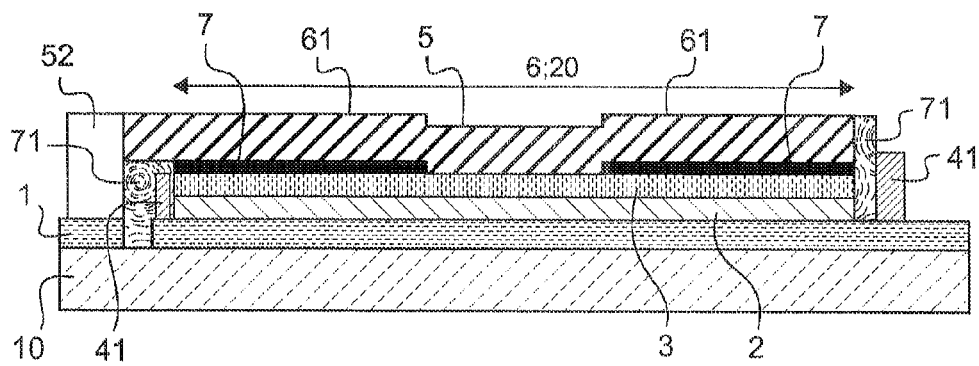
Figure 4:
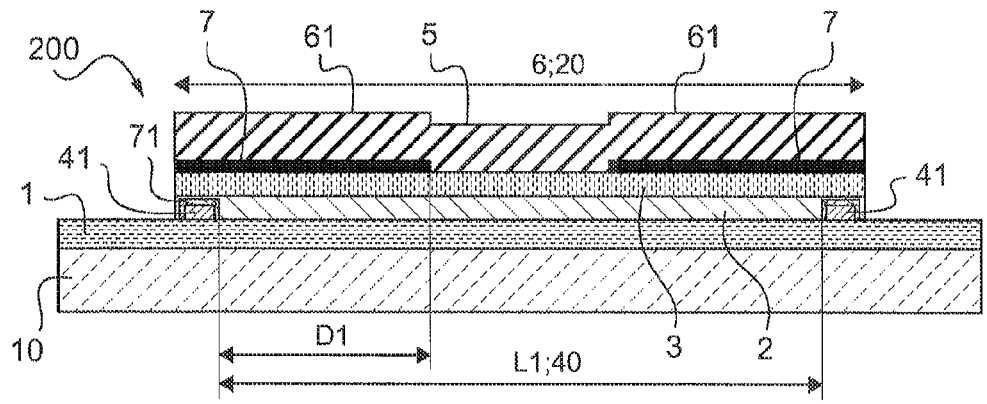
Figure 5:
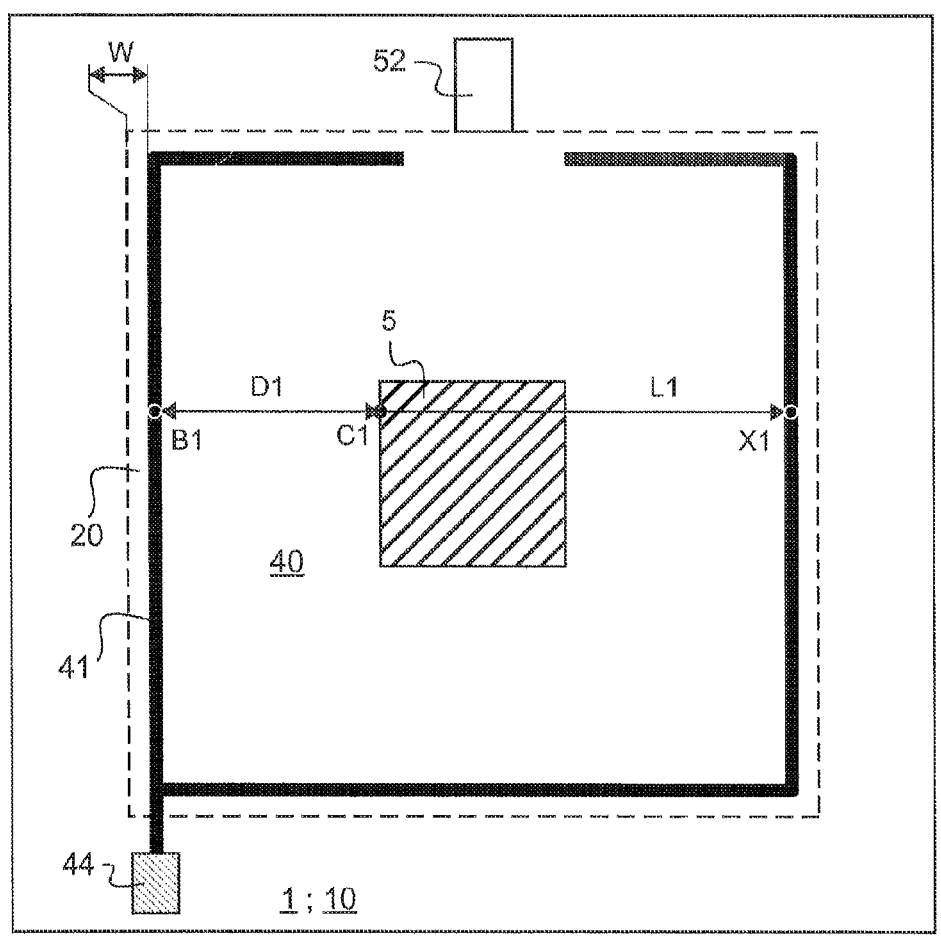
Figure 6:
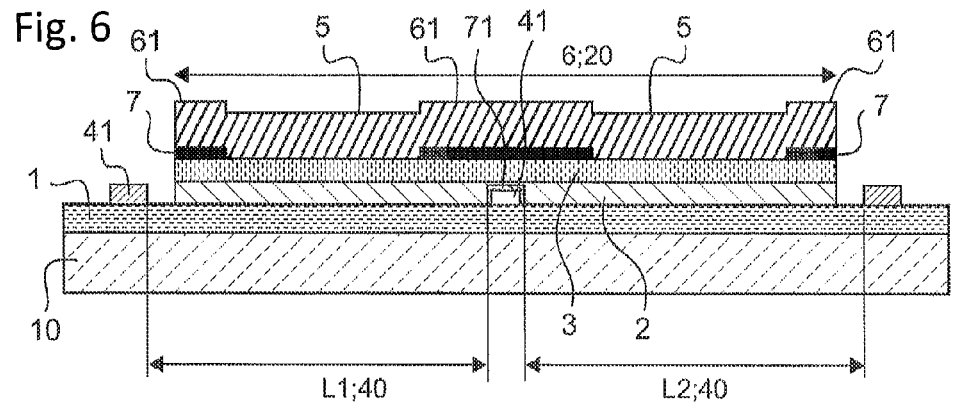
Figure 7:
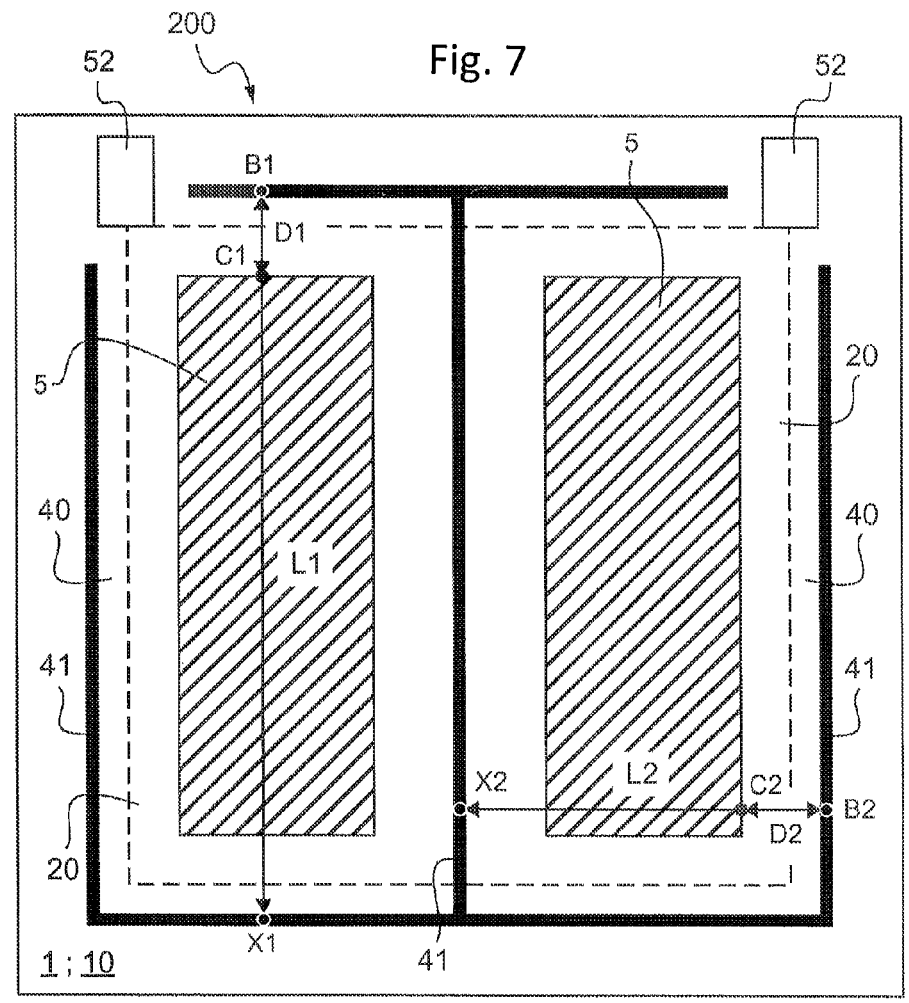
Figure 8:
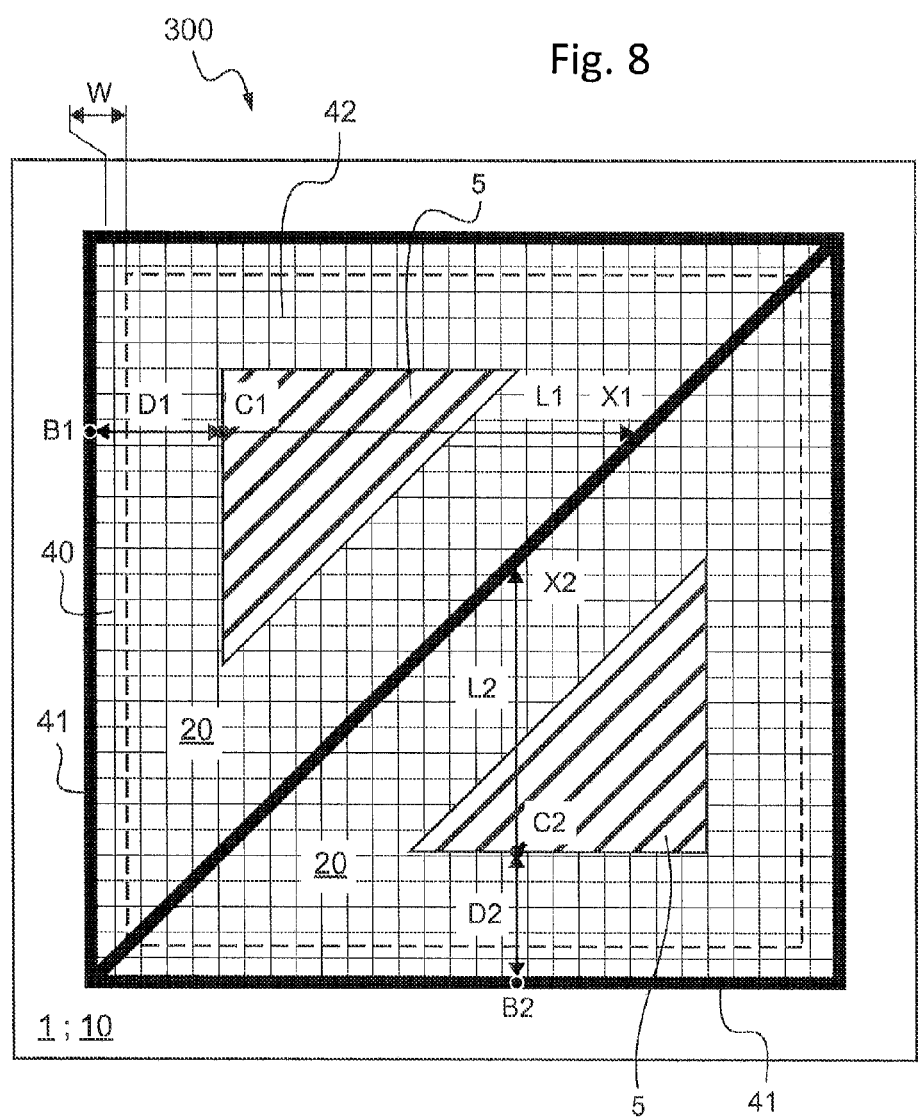
Figure 9:
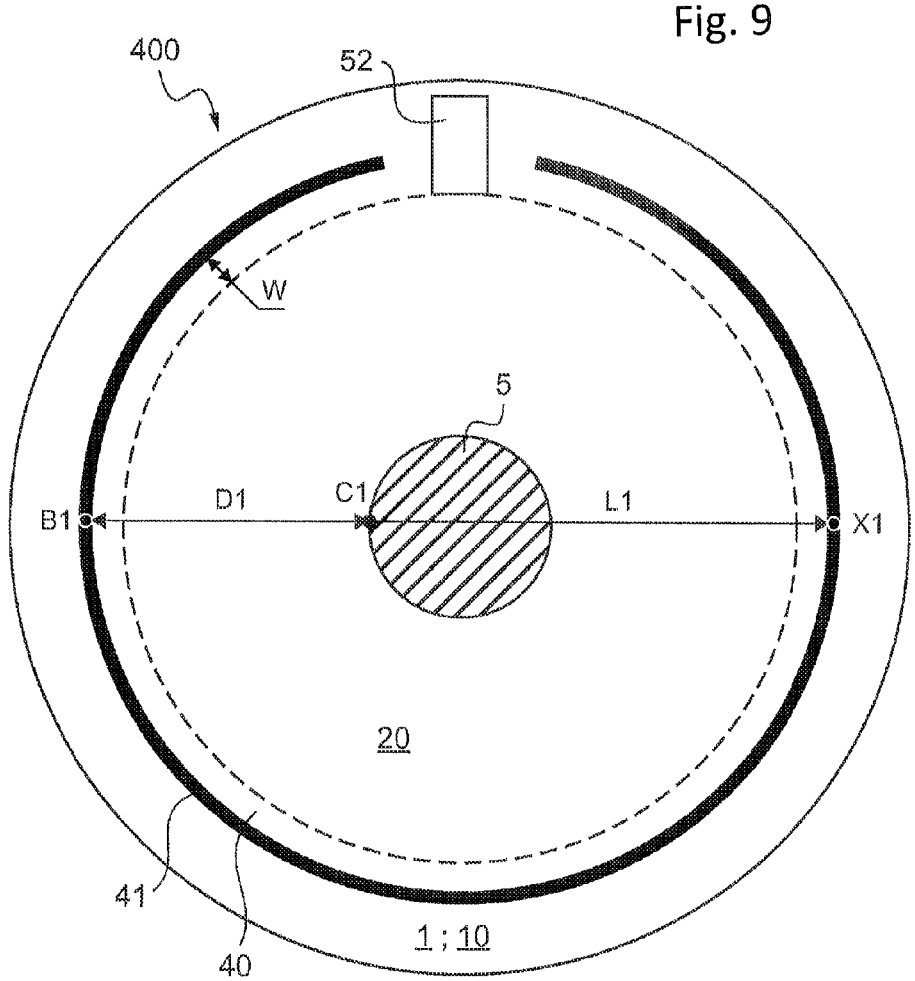
Figure 10:
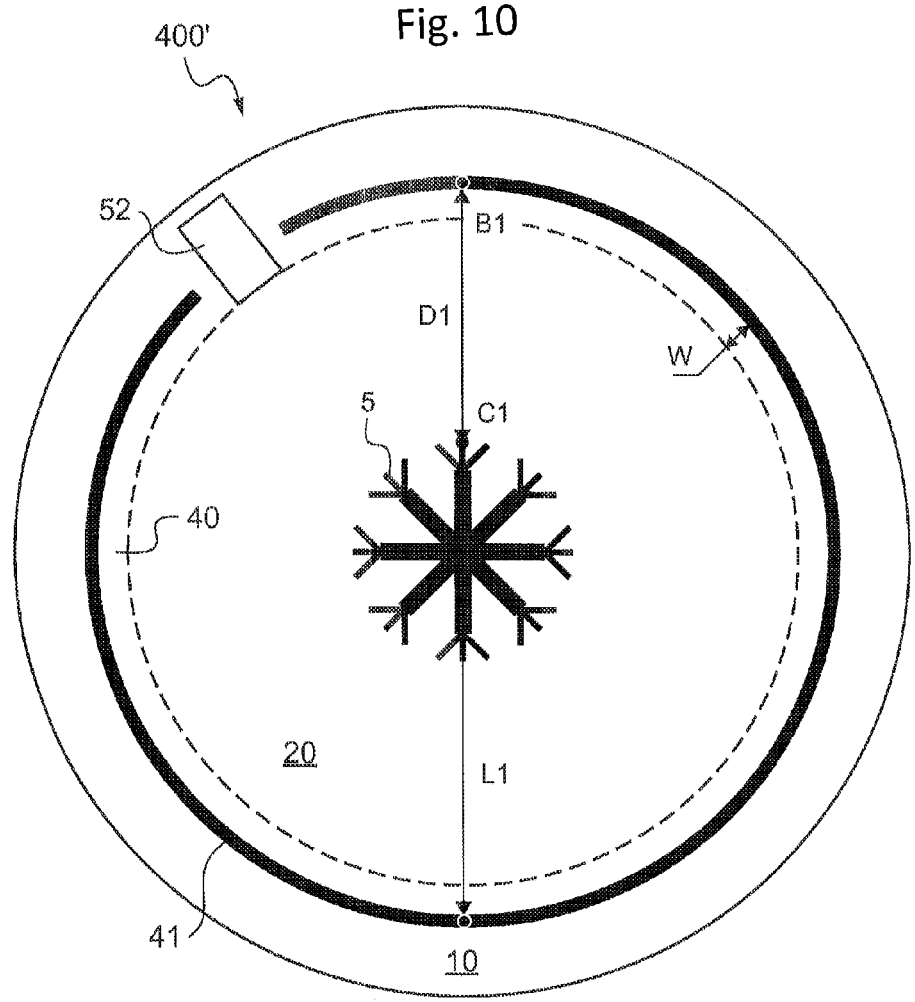
Figure 11:
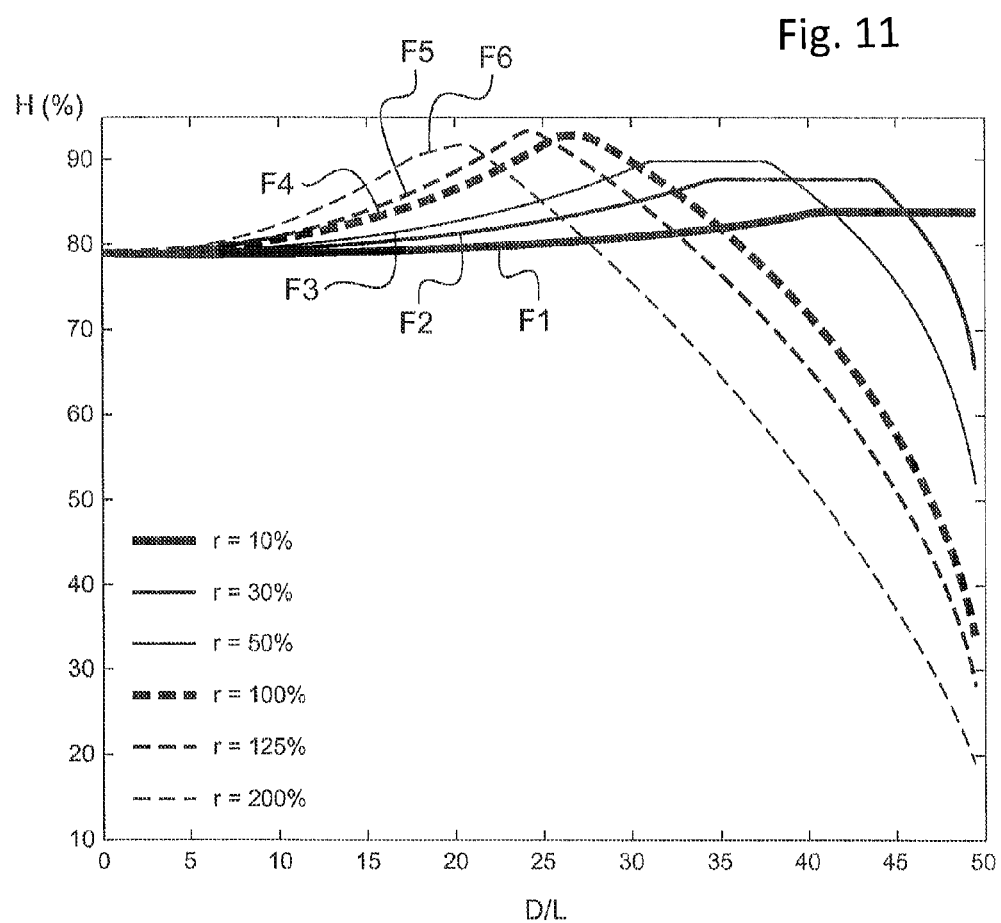
Figure 12:
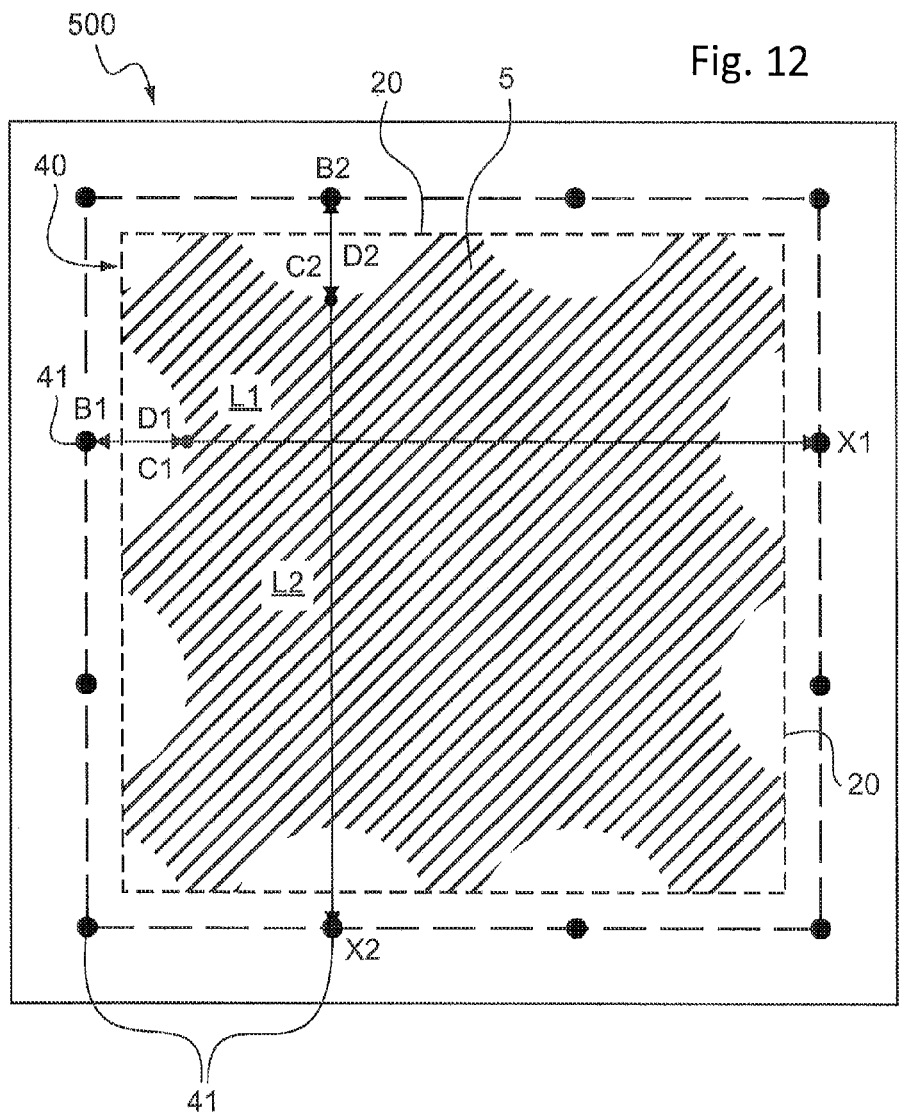
Figure 13A:
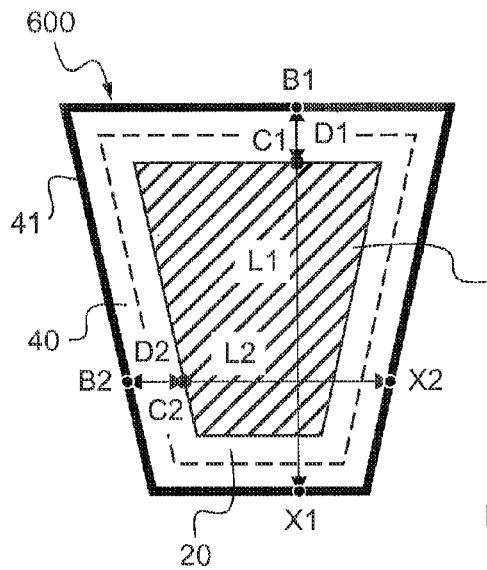
Figure 13B:
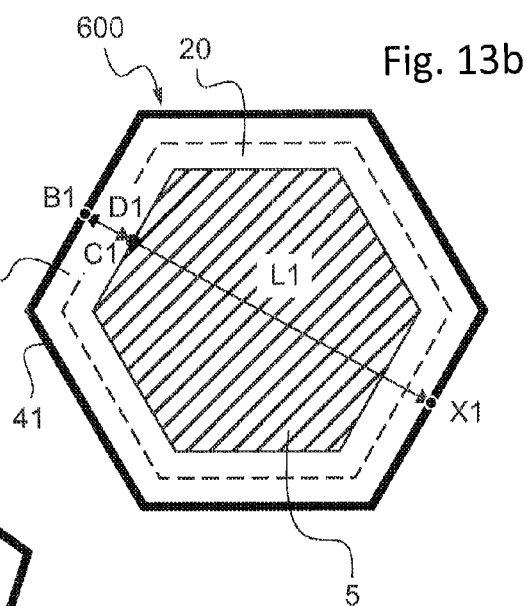
Figure 13D:
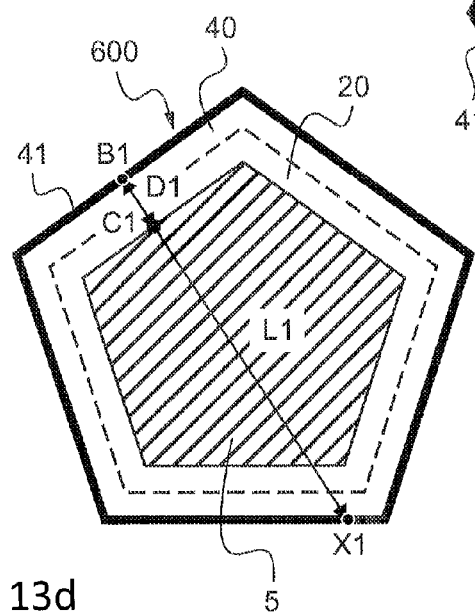
Figure 13C:
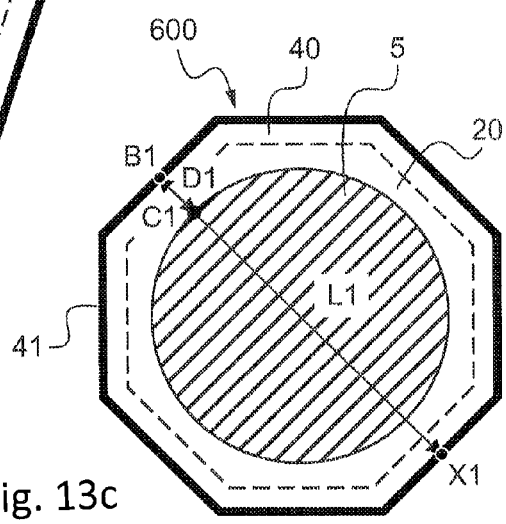
Figure 14:
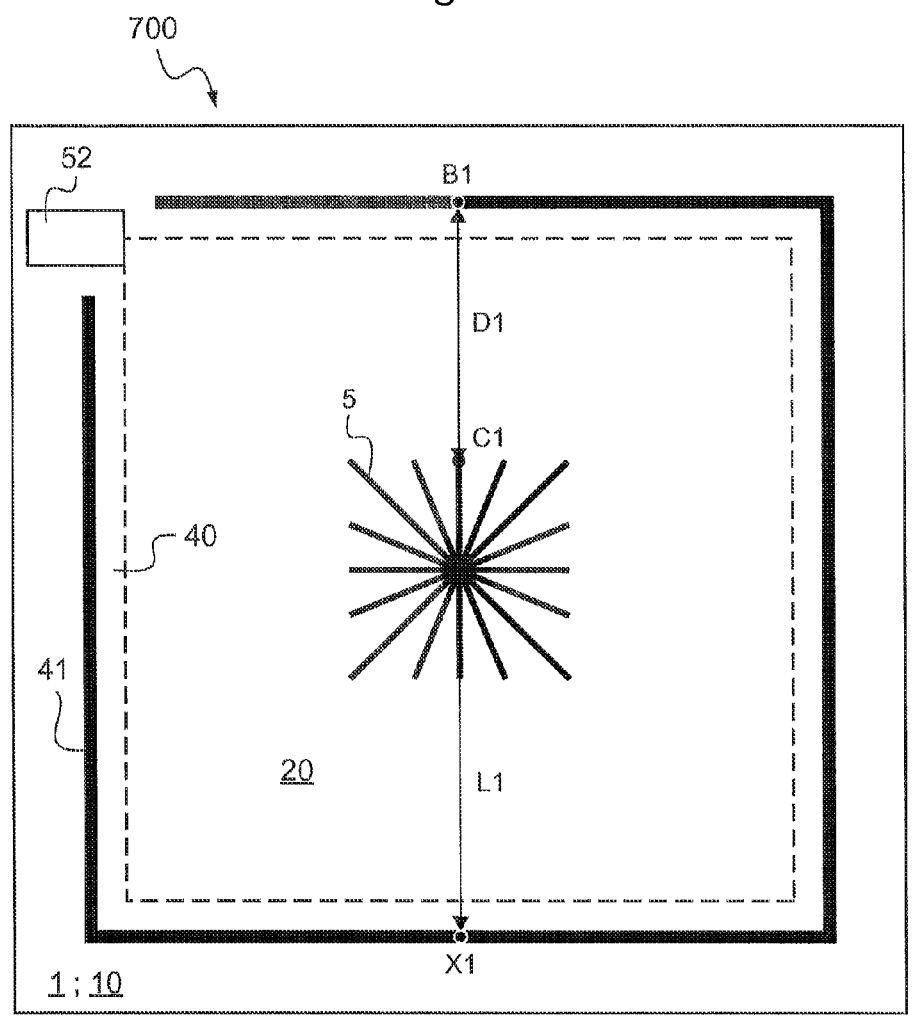
FIG. 14 illustrates a variant of FIG. 2a in which the solid contact surface is replaced with a star-like contact surface 5, fanning out bundle-like, preferably retaining a square contour.
Figure 15:
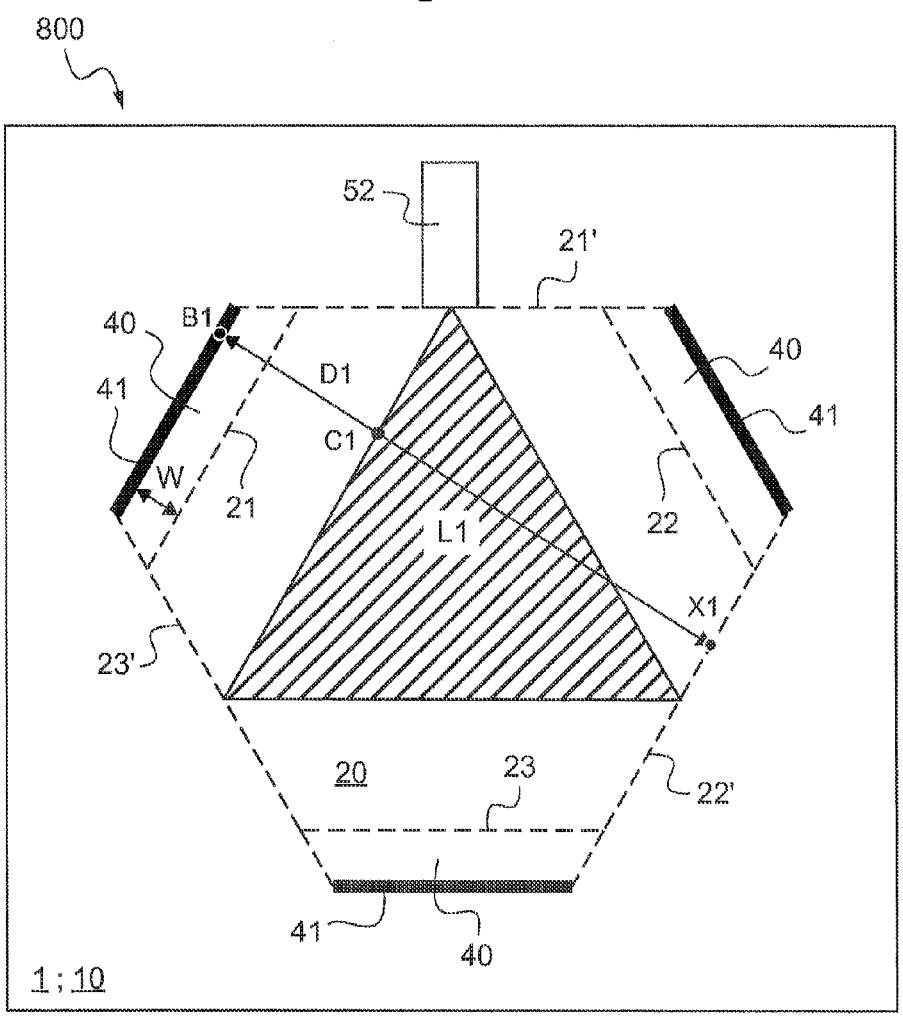
FIG. 15 illustrates a schematic and partial view from above of a hexagonal active zone 20.
Figure 16:
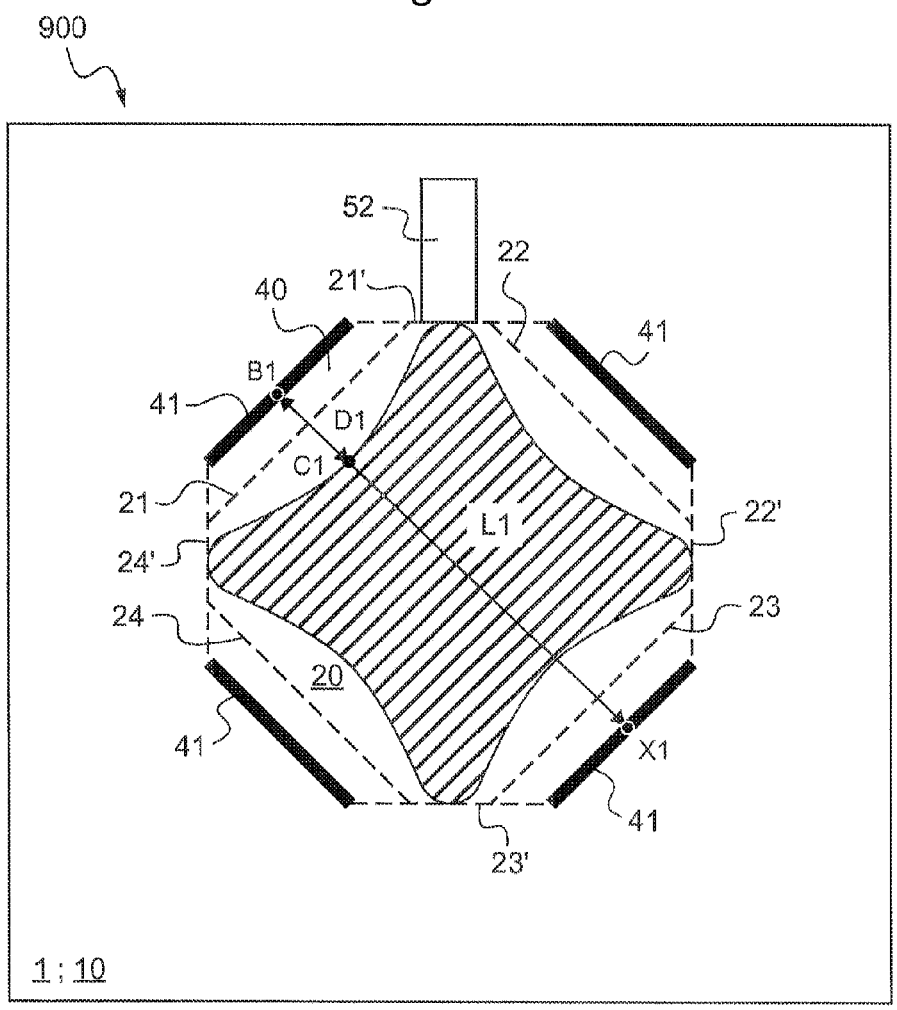

FIG. 16 illustrates a schematic and partial view from above of an octagonal active zone 20.

The first extended tailored anode contact 41, and three second extended tailored anode contacts 41, are along non-adjacent edges of the active zone 21, 22, 23, 24.

Here the cathode contact is star-like going as far as the edges of the active zone without anode contacts 21', 22', 23'.

The invention claimed is:

1. An organic light-emitting diode device, comprising:
    a transparent substrate with a first main face comprising a stack comprising in this order, starting from said first main face:
        a lower electrode forming an anode, which is transparent, said anode having a sheet resistance R1,
        an organic light-emitting system above the anode,
        an upper electrode forming a cathode and arranged above the organic light-emitting system, said cathode having a sheet resistance R2, the ratio r=R2/R1 ranging from 0.01 to 2.5,
    the anode, the organic light-emitting system and the cathode defining an active common zone,
    a first anode electrical contact delimiting, alone or with optional one or more second anode electrical contacts, a contour of a first region of a surface of the anode,
    a first cathode electrical contact, which is:
        arranged above the active common zone, partially covering a region of the cathode above the first region,
        of a contact surface that is smaller than a surface area of the active common zone and than a surface area of the first region,
        offset from the first anode electrical contact and from the optional one or more second anode electrical contacts, at every point of the contact surface, and
    above the organic light-emitting system, away from the first main face, a reflector covering the active common zone,
    wherein, for each point B of the first anode electrical contact and of each optional second anode electrical contact, the point B being in a first edge of the first region, on defining a distance D between said point B and a point C of the contact surface which is closest to said point B, and on defining a distance L between said point B and a point X of an opposite edge of the first region from the first edge, passing through C the following criteria are defined:
        if $0.01 \leq r < 0.1$, then $30\% < D/L < 48\%$,
        if $0.1 \leq r < 0.5$, then $10\% < D/L < 45\%$,
        if $0.5 \leq r < 1$, then $10\% < D/L < 45\%$,
        if $1 \leq r < 1.5$, then $5\% < D/L < 35\%$,
        if $1.5 \leq r < 2.5$, then $5\% < D/L < 30\%$.

2. The organic light-emitting diode device as claimed in claim 1, wherein the contact surface extends from a center of the first region to edges of the active common zone.

3. The organic light-emitting diode device as claimed in claim 1, wherein the contact surface is a solid surface, or a grid-like surface, the surface optionally being star-like.

4. The organic light-emitting diode device as claimed in claim 1, wherein:
    if $0.04 \leq r < 0.1$, then $40\% < D/L < 48\%$,
    if $0.1 \leq r < 0.5$, then $30\% < D/L < 45\%$,
    if $0.5 \leq r < 1$, then $20\% \leq D/L \leq 40\%$,
    if $1 \leq r < 1.5$, then $10\% < D/L \leq 35\%$,
    if $1.5 \leq r < 2.5$, then $15\% \leq D/L \leq 25\%$.

5. The organic light-emitting diode device as claimed in claim 1, comprising one or more resistive anode electrical contacts arranged in the first region and linked to the first anode electrical contact and/or to the optional one or more second anode electrical contacts, said one or more resistive anode electrical contacts having a larger resistance than a resistance of the first anode electrical contact and/or the optional one or more second anode electrical contacts, and wherein the ratio r ranging from 0.01 to 2.5 is replaced with a ratio r'=R2/R'1 ranging from 0.01 and 2.5 in which R'1 is the equivalent sheet resistance of the assembly of anode and one or more resistive anode electrical contacts in the first region.

6. The organic light-emitting diode device as claimed in claim 1, wherein the first anode electrical contact extends and forms alone or with the optional one or more second anode electrical contacts a closed or quasi-closed contour.

7. The organic light-emitting diode device as claimed in claim 1, wherein the first cathode electrical contact has a surface homothetic to the surface of the first region.

8. The organic light-emitting diode device as claimed in claim 5, wherein the first region is a square or a rectangle, the first cathode electrical contact is cross-shaped, centered, cross according to diagonals of the first region, and the ratio r or r' is chosen equal to $1.1 \pm 0.1$ or wherein the first region is disk-shaped, the first cathode electrical contact centered with $1 \leq r$ or $r' < 1.5$ and $20\% < D/L \leq 30\%$.

9. The organic light-emitting diode device as claimed in claim 1, wherein the first anode electrical contact is an extended contact, and at least two of the optional one or more second anode electrical contacts are of extended type and wherein $Lp < 0.25P$, with Lp being the distance between each extended contact and P a perimeter of the first region.

10. The organic light-emitting diode device as claimed in claim 1, wherein the first anode electrical contact is a point-like contact, and wherein the optional one or more second anode electrical contacts are point-like contacts and are distributed so as to delimit the first region, and wherein the distance between each point-like contact is less than half a maximum distance Lmax of the first region.

11. The organic light-emitting diode device as claimed in claim 1, wherein the cathode is transparent or semi-reflecting, wherein the reflector comprises a reflecting covering element above the cathode on moving away from the first main face, the reflecting covering element being separated from the cathode by an electrical insulating element, and wherein the first cathode electrical contact, adjacent to the electrical insulating element, forms part of the reflector and is in contact or electrically coupled with the reflecting covering element.

12. The organic light-emitting diode device as claimed in claim 11, wherein the first cathode electrical contact is based on the same material as the reflecting covering element, wherein the first cathode electrical contact and the reflecting covering element are formed by a continuous layer on the electrical insulating element and the cathode and the continuous layer is based on the same material as the cathode.

13. The organic light-emitting diode device as claimed in claim 12, wherein the cathode comprises a layer based on aluminum and the first cathode electrical contact comprises a layer based on aluminum.

14. The organic light-emitting diode device as claimed in claim 1, wherein the reflector comprises a Bragg mirror, adjacent to the first cathode electrical contact, and the first cathode electrical contact forms part of the reflector.

15. A method for homogenizing the luminance of a back-emitting organic light-emitting device with a transparent substrate with a first main face comprising a stack comprising in this order, starting from said first main face:
    a lower electrode forming an anode, which is transparent, anode of sheet resistance R1,
    an organic light-emitting system above the anode,
    an upper electrode forming a cathode, above the organic light-emitting system comprising an electroconducting layer, cathode of sheet resistance R2,
the anode, the organic light-emitting system and the cathode defining an active common zone a first anode electrical contact, a first cathode electrical contact of contact surface less than a surface of the active common zone, the method comprising:

adjusting a ratio r=R2/R1 ranging from 0.01 to 2.5, positioning the first cathode electrical contact above the active common zone, and selecting a size of the contact surface so as to obtain a luminance homogeneity of the active common zone greater than or equal to 5% to that of an organic light-emitting diode device differing through the choice of an aluminum cathode of 100 nm, arranging a reflector above the cathode.

16. The organic light-emitting diode device as claimed in claim 6, wherein the first cathode electrical contact is substantially centered with respect to the edges of the first region or with respect to the first anode electrical contact and/or the optional one or more second anode electrical contacts.

17. The organic light-emitting diode device as claimed in claim 7, wherein the first region is round and/or homothetic to the surface of the active common zone.

* * * * *